United States Patent
Moriyasu et al.

(10) Patent No.: US 6,528,387 B1
(45) Date of Patent: Mar. 4, 2003

(54) SOI SUBSTRATE AND PROCESS FOR PREPARING THE SAME, AND SEMICONDUCTOR DEVICE AND PROCESS FOR PREPARING THE SAME

(75) Inventors: Yoshitaka Moriyasu, Fuji (JP); Takashi Morishita, Fuji (JP); Masahiro Matsui, Fuji (JP); Makoto Ishida, Toyohashi (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/446,306

(22) Filed: Dec. 20, 1999

(30) Foreign Application Priority Data

Jun. 19, 1997 (JP) .............................. 9-162313
Aug. 11, 1997 (JP) .............................. 9-216368

(51) Int. Cl.$^7$ .............................. H01L 21/76
(52) U.S. Cl. .................. 438/404; 438/413; 438/479
(58) Field of Search ................. 438/404, 479, 438/480, 400, 14, 17

(56) References Cited

U.S. PATENT DOCUMENTS

| | | | |
|---|---|---|---|
| 4,177,084 A | | 12/1979 | Lau et al. |
| 4,470,618 A | | 9/1984 | Ono |
| 4,588,447 A | * | 5/1986 | Golecki |
| 5,374,581 A | | 12/1994 | Ichikawa et al. |
| 5,416,043 A | | 5/1995 | Burgener et al. |
| 5,658,809 A | * | 8/1997 | Nakashima et al. |
| 6,121,117 A | * | 9/2000 | Sato et al. |

FOREIGN PATENT DOCUMENTS

| | | |
|---|---|---|
| JP | 51-80160 | 7/1976 |
| JP | 55-146936 | 11/1980 |
| JP | 56-142626 | 11/1981 |
| JP | 58-28855 | 2/1983 |
| JP | 59-82744 | 5/1984 |
| JP | 59-082744 | 5/1984 |
| JP | 62-176145 | 8/1987 |
| JP | 01-011316 | 1/1989 |
| JP | 01-036046 | 2/1989 |
| JP | 1-261300 | 10/1989 |
| JP | 5-217821 | 8/1993 |
| JP | 9-64016 | 3/1997 |

OTHER PUBLICATIONS

Seijiro Furukawa, "Techniques for SOI Structure Formation," Oct. 23, 1987, pp. 131–135.

Sato et al., "Hydrogen Annealed Silicon–On–Insulator," Applied Physics Letters, American Institute of Physics, vol. 65, No. 15, Oct. 10, 1994, pp. 1924–1926.

Giles et al., "Characterization of Crystallographic Defects in Thermally Oxidized SIMOX Materials," Materials Science & Engineering B, Elsevier Sequoia, vol. 41, No. 1, Oct. 1, 1996, pp. 182–185.

Thompson et al., "X–ray–Diffraction Characterization of Silicon–on–Insulator Films," Journal of Applied Physics, vol. 70, No. 9, Nov. 1, 1991, pp. 4760–4769.

* cited by examiner

*Primary Examiner*—Tuan H. Nguyen
(74) *Attorney, Agent, or Firm*—Finnegan, Henderson, Farabow, Garrett & Dunner, L.L.P.

(57) ABSTRACT

When producing an SOS substrate by growing a silicon layer on a sapphire substrate, or when producing an SOI substrate by depositing an oxide layer or a fluoride layer, as an intermediate layer, on a silicon substrate, and growing a silicon layer on the deposited layer, (A) after growth of the silicon layer, heat treatment is performed in an oxidizing atmosphere to oxidize a part of a surface side of the silicon layer, and the resulting silicon oxide layer is removed by etching with hydrofluoric acid. (B) With this silicon layer as a seed layer, a silicon layer is regrown homoepitaxially thereon.

77 Claims, 11 Drawing Sheets

SOI SUBSTRATE AND PROCESS FOR PREPARING THE SAME, AND SEMICONDUCTOR DEVICE AND PROCESS FOR PREPARING THE SAME

TECHNICAL FIELD

This invention relates to a semiconductor substrate having a single crystalline silicon semiconductor layer formed on an insulator layer, such as a silicon on insulator (SOI) substrate or a silicon on sapphire (SOS) substrate, and a method for producing the semiconductor substrate. More specifically, the invention relates to a semiconductor substrate having a silicon layer with minimal dislocation or few defects and with satisfactory surface flatness, and a method for producing the semiconductor substrate. The invention also concerns a semiconductor device formed on the semiconductor substrate, and a method for producing the semiconductor device.

BACKGROUND ART

SOI and SOS have been known as substrate materials having a structure in which a single crystalline silicon semiconductor layer is formed on an insulator. In the present specification, semiconductor substrates (including the SOI substrate and the SOS substrate) having a single crystalline silicon semiconductor layer formed on an insulator layer are collectively called SOI substrates. These SOI substrates are applied widely to the preparation of devices, and surpass ordinary silicon substrates in the following respects:

(1) Excellency in high speed characteristics because of decreased parasitic capacitance
(2) High resistance to soft error
(3) Latch up free
(4) Omissibility of the well forming process.

To realize these advantages in device performance, the following methods for producing the SOI substrates have been available:

(i) Bonding method: A silicon single crystalline substrate is bonded to another silicon single crystalline substrate, whose surface has been thermally oxidized, by heat treatment or with the use of an adhesive, and then one of the silicon layers is converted to a uniform thin film by mechanical polishing or chemical etching.

(ii) SIMOX (separation by ion implanted oxide) method: Oxygen ions are implanted into a silicon substrate, and then this substrate is heat treated to prepare a buried $SiO_2$ (silicon oxide) layer in the silicon substrate.

(iii) Solid phase epitaxial growth method: The surface of a silicon substrate is oxidized, whereafter a window is opened in a part of the resulting oxide film to expose the silicon substrate, on which an amorphous silicon layer is grown. Then, heat treatment is applied to crystallize the amorphous silicon layer by lateral solid phase epitaxial growth, starting at the portion in contact with the exposed silicon.

(iv) Heteroepitaxial growth method: A single crystalline silicon layer is grown on an insulating oxide substrate, or the oxide or fluoride layer which is deposited on a silicon substrate by CVD or the like.

However, these methods have both merits and demerits, and still remain problematical in productivity and quality. With the bonding method, for example, the silicon substrate itself needs to be formed into a thin film, but it is extremely difficult to etch or polish the silicon substrate accurately and uniformly to a thickness of 1 $\mu$m or less. The SIMOX method has been studied for a long time, but has posed problems about productivity and cost, because a large amount of oxygen ions must be implanted into the silicon substrate in order to form the buried oxide film of $SiO_2$ in the silicon substrate. This method also involves the problems of many crystalline defects present in the silicon layer, and the presence of defects, called pipes, in the buried oxide film.

In addition, the bonded SOI substrate and the SIMOX substrate have the drawbacks that the drain breakdown voltage and the ESD (electrostatic discharge) of a device prepared thereon (e.g., a field effect transistor) are low. These are problems about quality. The drain breakdown voltage refers to a phenomenon encountered with the device being an FET (field effect transistor), the phenomenon that when the device acts as an FET, hot carriers occurring in the junction between the body and the drain accumulate in the body, abruptly increasing a drain current flowing among the drain, the body and the source, and lowering the breakdown voltage. The ESD refers to breakdown voltage at which the device is broken by an electric shock such as static electricity. According to the specifications, the value of this parameter is 2,000 V, at which devices can usually withstand the static electricity generated by a human.

As one of the SOI technique, the SOS technology is known. The SOS substrate has been used mainly for devices requiring radiation hardness in addition to the features of the SOI substrate, such as small parasitic capacitance. The SOS substrate has features that noise throughout this substrate is low, because of a thick insulating layer. With the SOS substrate, moreover, the life time of carriers at the interface between the silicon layer and sapphire is short. When the FET works, therefore, hot carriers occurring in the junction between the body and the drain immediately recombine, and minimally accumulate in the body. Hence, the current flowing among the drain, the body and the source does not increase rapidly, so that the breakdown voltage does not decrease. That is, high drain breakdown voltage is a remarkable feature of the SOS substrate. However, the SOS substrate is prepared by heteroepitaxial growth of silicon on a sapphire substrate. Differences in lattice constant and thermal expansion coefficient between the silicon layer and the sapphire substrate ($\alpha$-$Al_2O_3$) lead to many crystalline defects and great surface roughness, which are remaining as problems.

As an SOI substrate having an intermediate layer, such as an oxide layer or a fluoride layer, on a silicon substrate, and a single crystalline silicon layer epitaxially grown on the intermediate layer, the one having an intermediate layer of, that is, $\gamma$-$Al_2O_3$ is known (Japanese Patent Application Laid-open No. 1-261300 (1989)). With such an SOI substrate, it is similarly expected that the life time of carriers at the interface between the silicon layer and the intermediate layer will be short, and thus high drain breakdown voltage comparable to that of the SOS substrate will be obtained. This type of substrate also has the problems of poor crystallinity and large surface roughness of the silicon layer due to differences in lattice constant and thermal expansion coefficient.

A method known to improve the crystallinity of the silicon layer in the SOS substrate involves implanting silicon ions into the silicon layer to make the interface with the sapphire amorphous, and then annealing the layer to recrystallize it (U.S. Pat. No. 4,177,084). According to this method, the silicon layer has fewer crystalline defects and higher crystallinity than that heteroepitaxially grown on a sapphire substrate, but still has about $10^9$ crystalline defects, especially stacking faults, per $cm^2$ remaining therein.

The silicon layer in these SOS substrates and SOI substrates also has the problem that the density of crystalline defects is higher at a site closer to the interface with the insulating substrates or the insulating layer on silicon substrate. This means that very many crystalline defects are contained in a thin silicon layer with a thickness of 0.05 to 0.3 μm, as in the case of preparation of a high speed, low electric power consumption device.

The silicon layer in these SOS substrates and SOI substrates, moreover, is poor in orientation, and may include components of a (110)-plane or a (111)-plane in a (001)-plane. In addition, the silicon layer in these SOS substrates and SOI substrates include distortion, because of a large difference between the lattice constant of the (001)-plane grown parallel to the substrate surface and the lattice constant of a (100)-plane grown perpendicular to the substrate surface.

Compared with the bonded SOI substrate or the SIMOX substrate, the SOS substrate or the SOI substrate with an intermediate layer, such as an oxide layer or fluoride layer, deposited on a silicon substrate is poor in the crystallinity and surface flatness of the silicon layer. If a semiconductor device, such as MOSFET (metal-oxide-semiconductor field effect transistor), is formed on any of these substrates, flicker noise may be caused, or the operating performance or reliability of the FET may be deteriorated due to a decrease in breakdown voltage, ESD, effective mobility or transconductance.

As a method for improving the surface flatness of the silicon layer, it is known to heat-treat a bonded SOI substrate, having an insulator layer of $SiO_2$, in a deoxidizing atmosphere (see Japanese Patent Application Laid-open No. 5-217821 (1993)). This method improved flatness, but showed no improvement in drain breakdown voltage or ESD, because the underlying layer is $SiO_2$.

To ensure reliability of the device, it is preferred for the drain breakdown voltage or ESD to be higher. In an SOS substrate, or an SOI substrate having an intermediate layer, such as an oxide layer or fluoride layer, deposited on a silicon substrate, and a crystalline silicon layer epitaxially grown on the intermediate layer, it will be extremely useful for the performance and reliability of the device if the crystallinity and surface flatness of the silicon layer are improved, whereby the device performance ascribed to these properties is upgraded, or if the drain breakdown voltage or ESD is further increased.

DISCLOSURE OF THE INVENTION

The present invention aims to solve the problems with the conventional SOS substrate, or the conventional SOI substrate having an intermediate layer, such as an oxide layer or fluoride layer, deposited on a silicon substrate, and a silicon layer epitaxially grown on the intermediate layer; to provide an SOI substrate satisfactory in crystallinity and surface flatness, and having a crystalline defect density uniformly low in the depth direction; and to provide a semiconductor device having excellent properties, such as high speed, low flicker noise, high drain breakdown voltage, and high ESD, the semiconductor device being formed on the SOI substrate.

Under these circumstances, the inventors of the present invention found the following facts when producing an SOS substrate by growing a silicon layer on a sapphire substrate, or when producing an SOI substrate by depositing an oxide layer or a fluoride layer, as an intermediate layer, on a silicon substrate, and growing a silicon layer on the deposited layer: (A) After growth of the silicon layer, heat treatment is performed in an oxidizing atmosphere to oxidize a part of the silicon layer on its surface side. The resulting silicon oxide layer is etched with hydrofluoric acid, whereby a highly oriented silicon layer with few defects is left behind. (B) This silicon layer is used as a seed layer, and a silicon layer is regrown homoepitaxially on the seed layer, whereby a highly crystalline, highly oriented silicon layer with very few defects can be formed. These findings led the inventors to accomplish the present invention.

The inventors also found the following facts when producing an SOS substrate by growing a silicon layer on a sapphire substrate, or when producing an SOI substrate by depositing an oxide layer or a fluoride layer, as an intermediate layer, on a silicon substrate, and growing a silicon layer on the deposited layer: (C) After growth of the silicon layer, the silicon layer is heated in a hydrogen atmosphere, whereby the crystallinity and surface flatness of the silicon layer are markedly improved. (D) While the silicon layer is being grown, its growth is interrupted, and the system is heat treated in a hydrogen atmosphere to improve the surface flatness and crystallinity of the silicon layer. Then, epitaxial growth of the silicon layer is performed again. As a result, there can be prepared a silicon layer very satisfactory in surface flatness and minimal in dislocation or defects due to the lattice mismatch, that is a problem with heteroepitaxial growth. These findings led the inventors to accomplish the present invention.

The inventors further found the following fact when MOSFET, for example, is formed on an SOI substrate prepared by the above described manufacturing method, the SOI substrate having few defects, having high crystallinity and high orientation, and minimal in surface roughness, its performance can be remarkably improved, such as increases in operating speed and ESD, and a decrease in flicker noise, in comparison with conventional products. This finding led the inventors to accomplish the present invention.

That is, an SOI substrate claimed in claim 1 of the present invention is an SOI substrate comprising an insulating layer on silicon substrate, and a crystalline silicon layer epitaxially grown on the insulating layer on silicon substrate, the insulating layer on silicon substrate being composed of a single crystalline oxide substrate, or a multiple-layer substrate comprising a silicon substrate and a crystalline oxide layer or fluoride layer deposited on the silicon substrate, wherein the defect density of the crystalline silicon layer is not more than $4 \times 10^8/cm^2$, and the surface roughness of the crystalline silicon layer is not more than 4 nm but not less than 0.05 nm.

An SOI substrate claimed in claim 2 of the present invention is the SOI substrate of claim 1, wherein the defect density of the crystalline silicon layer is not more than $4 \times 10^8/cm^2$ in an entire depth direction.

An SOI substrate claimed in claim 3 of the present invention is the SOI substrate of claim 1, wherein the defect density of the crystalline silicon layer is not more than $1 \times 10^7/cm^2$.

An SOI substrate claimed in claim 4 of the present invention is the SOI substrate of claim 1, wherein the defect density of the crystalline silicon layer is not more than $1 \times 10^7/cm^2$ in an entire depth direction.

An SOI substrate claimed in claim 5 of the present invention is the SOI substrate of claim 1, wherein the full width at half maximum of the X-ray diffraction rocking curve of a (004)-peak in the crystalline silicon layer, grown parallel to the surface of the substrate, is not more than 1,000 arcsec but not less than 100 arcsec.

An SOI substrate claimed in claim 6 of the present invention is the SOI substrate of claim 1, wherein the lattice constant of a silicon (100)-plane in the crystalline silicon layer perpendicular to the surface of the substrate is not less than 5.41 angstroms but not more than 5.44 angstroms.

An SOI substrate claimed in claim 7 of the present invention is the SOI substrate of claim 1, wherein the lattice constant of a silicon (001)-plane in the crystalline silicon layer parallel to the surface of the substrate is not more than 5.44 angstroms but not less than 5.41 angstroms.

An SOI substrate claimed in claim 8 of the present invention is the SOI substrate of claim 1, wherein the ratio of the lattice constant of a silicon (001)-plane in the crystalline silicon layer parallel to the surface of the substrate to the lattice constant of a silicon (100)-plane in the crystalline silicon layer perpendicular to the surface of the substrate is not more than 1.005 but not less than 0.995.

An SOI substrate claimed in claim 9 of the present invention is the SOI substrate of claim 1, wherein the ratio of the intensity of a 220-reflection to the intensity of a 004-reflection in the crystalline silicon layer parallel to the surface of the substrate, both reflections determined in X-ray diffraction measurement, is not more than 0.1.

An SOI substrate claimed in claim 10 of the present invention is the SOI substrate of claim 1, wherein the insulating layer on silicon substrate is the single crystalline oxide substrate, and the single crystalline oxide substrate is a sapphire substrate.

An SOI substrate claimed in claim 11 of the present invention is the SOI substrate of claim 1, wherein the insulating layer on silicon substrate is the multiple-layer substrate, and the crystalline oxide layer deposited on the silicon substrate as a substrate of the multiple-layer substrate comprises any of $\alpha$-$Al_2O_3$, $\gamma$-$Al_2O_3$, $\theta$-$Al_2O_3$, $MgO \cdot Al_2O_3$, $CeO_2$, $SrTiO_3$, $(Zr_{1-x}, Y_x)O_y$, $Pb(Zr,Ti)O_3$, $LiTaO_3$, and $LiNbO_3$, and the fluoride layer comprises $CaF_2$.

A method for producing an SOI substrate claimed in claim 12 of the present invention is a method for producing an SOI substrate having a silicon layer with a low defect density formed on an insulating layer on silicon substrate, comprising the steps of:
(a) forming a silicon layer on the insulating layer on silicon substrate;
(b) heat treating the silicon layer in an oxidizing atmosphere to oxidize a part of a surface side of the silicon layer; and
(c) removing a silicon oxide film formed in the preceding step (b) by etching.

A method for producing an SOI substrate claimed in claim 13 of the present invention is a method for producing an SOI substrate having a silicon layer with a low defect density formed on an insulating layer on silicon substrate, comprising the steps of:
(a) forming a first silicon layer on the insulating layer on silicon substrate;
(b) heat treating the first silicon layer in an oxidizing atmosphere to oxidize a part of a surface side of the first silicon layer;
(c) removing a silicon oxide film formed in the preceding step (b) by etching; and
(d) epitaxially growing a second silicon layer on the remaining first silicon layer.

A method for producing an SOI substrate claimed in claim 14 of the present invention is the method of claim 13, further comprising repeating the steps (b) to (d) two or more times on condition that a silicon layer formed in the step (d) is regarded as the first silicon layer formed in the step (a).

A method for producing an SOI substrate claimed in claim 15 of the present invention is the method of any one of claims 12 to 14, wherein the oxidizing atmosphere contains a gas mixture of oxygen and hydrogen, or contains steam.

A method for producing an SOI substrate claimed in claim 16 of the present invention is the method of any one of claims 12 to 14, wherein the temperature of heat treatment in the oxidizing atmosphere is not lower than 600° C. but not higher than 1,300° C.

A method for producing an SOI substrate claimed in claim 17 of the present invention is the method of any one of claims 12 to 14, wherein the temperature of heat treatment in the oxidizing atmosphere is not lower than 800° C. but not higher than 1,200° C.

A method for producing an SOI substrate claimed in claim 18 of the present invention is the method of claim 13 or 14, wherein the temperature for epitaxial growth of the second silicon layer on the remaining first silicon layer is not lower than 550° C. but not higher than 1,050° C.

A method for producing an SOI substrate claimed in claim 19 of the present invention is the method of claim 13 or 14, wherein the temperature for epitaxial growth of the second silicon layer on the remaining first silicon layer is not lower than 650° C. but not higher than 950° C.

A method for producing an SOI substrate claimed in claim 20 of the present invention is the method of claim 13 or 14, wherein the remaining first silicon layer is heat treated in a hydrogen atmosphere or in a vacuum before the step of epitaxially growing the second silicon layer on the remaining first silicon layer.

A method for producing an SOI substrate claimed in claim 21 of the present invention is the method of claim 13 or 14, wherein no silicon oxide is formed on the surface of the remaining first silicon layer or in the second silicon layer in the step of epitaxially growing the second silicon layer on the remaining first silicon layer.

A method for producing an SOI substrate claimed in claim 22 of the present invention is the method of claim 13 or 14, wherein the base pressure of a growth chamber in an apparatus used in epitaxially growing the second silicon layer on the remaining first silicon layer is set at $10^{-7}$ Torr or less.

A method for producing an SOI substrate claimed in claim 23 of the present invention is the method of claim 13 or 14, wherein a method for epitaxially growing the second silicon layer on the remaining first silicon layer is UHV-CVD or MBE.

A method for producing an SOI substrate claimed in claim 24 of the present invention is the method of claim 13 or 14, wherein when epitaxially growing the second silicon layer on the remaining first silicon layer, a growth temperature is set to be high only at an initial stage of growth.

A method for producing an SOI substrate claimed in claim 25 of the present invention is the method of claim 24, wherein a method for epitaxially growing the second silicon layer is APCVD or LPCVD.

A method for producing an SOI substrate claimed in claim 26 of the present invention is the method of claim 12, further including the step of heat treating the SOI substrate in a nitrogen atmosphere after the step of removing the silicon oxide film by etching.

A method for producing an SOI substrate claimed in claim 27 of the present invention is the method of claim 13 or 14, further including the step of heat treating the SOI substrate in a nitrogen atmosphere after the step of epitaxially growing the second silicon layer.

A method for producing an SOI substrate claimed in claim 28 of the present invention is the method of claim 26 or 27, further including the step of heat treating the SOI substrate in an oxidizing atmosphere after the step of heat treating the SOI substrate in the nitrogen atmosphere.

A method for producing an SOI substrate claimed in claim 29 of the present invention is the method of claim 12, further including the step of heat treating the SOI substrate in a hydrogen atmosphere after the step of removing the silicon oxide film by etching.

A method for producing an SOI substrate claimed in claim 30 of the present invention is the method of claim 13 or 14, further including the step of heat treating the SOI substrate in a hydrogen atmosphere after the step of epitaxially growing the second silicon layer.

A method for producing an SOI substrate claimed in claim 31 of the present invention is the method of claim 29 or 30, wherein the temperature of the heat treatment in a hydrogen atmosphere is not lower than 800° C. but not higher than 1,200° C.

A method for producing an SOI substrate claimed in claim 32 of the present invention is the method of any one of claims 12 to 31, further including the step of implanting silicon ions after the step of forming the first silicon layer, to make a deep portion of the silicon layer amorphous, and performing annealing for recrystallization.

A method for producing an SOI substrate claimed in claim 33 of the present invention is the method of claim 32, wherein the annealing is performed first in a nitrogen atmosphere, and then performed in an oxidizing atmosphere.

A method for producing an SOI substrate claimed in claim 34 of the present invention is the method of claim 33, further including the step of removing a silicon oxide film by etching after the annealing in the oxidizing atmosphere.

A method for producing an SOI substrate claimed in claim 35 of the present invention is the method of claim 12, further comprising the step of applying chemical and/or mechanical polishing to the silicon layer after the step of removing the silicon oxide film by etching.

A method for producing an SOI substrate claimed in claim 36 of the present invention is the method of claim 13 or 14, further comprising the step of applying chemical and/or mechanical polishing to the silicon layer after the step of epitaxially growing the second silicon layer.

A method for producing an SOI substrate claimed in claim 37 of the present invention is the method of any one of claims 12 to 36, wherein the step of forming the first silicon layer on the insulating layer on silicon substrate is the step of epitaxially growing the first silicon layer on the insulating layer on silicon substrate.

A method for producing an SOI substrate claimed in claim 38 of the present invention is the method of any one of claims 12 to 37, wherein the insulating layer on silicon substrate is a single crystalline oxide substrate.

A method for producing an SOI substrate claimed in claim 39 of the present invention is the method of claim 38, wherein the insulating layer on silicon substrate is a sapphire substrate.

A method for producing an SOI substrate claimed in claim 40 of the present invention is the method of any one of claims 12 to 37, wherein the insulating layer on silicon substrate is a multiple-layer substrate comprising a silicon substrate as a substrate and a crystalline oxide layer or fluoride layer deposited on the silicon substrate.

A method for producing an SOI substrate claimed in claim 41 of the present invention is the method of claim 40, wherein the crystalline oxide layer comprises any of $\alpha\text{-}Al_2O_3$, $\gamma\text{-}Al_2O_3$, $\theta\text{-}Al_2O_3$, $MgO\cdot Al_2O_3$, $CeO_2$, $SrTiO_3$, $(Zr_{1-x},Y_x)O_y$, $Pb(Zr,Ti)O_3$, $LiTaO_3$, and $LiNbO_3$, and the crystalline fluoride layer comprises $CaF_2$.

A method for producing an SOI substrate claimed in claim 42 of the present invention is a method for producing an SOI substrate having a silicon layer with a low defect density formed on an insulating layer on silicon substrate, comprising the step of:

heat treating the silicon layer in a hydrogen atmosphere after forming the silicon layer on the insulating layer on silicon substrate.

A method for producing an SOI substrate claimed in claim 43 of the present invention is a method for producing an SOI substrate having a silicon layer with a low defect density formed on an insulating layer on silicon substrate, comprising the steps of:

(a) forming a first silicon layer on the insulating layer on silicon substrate;

(b) heat treating the first silicon layer in a hydrogen atmosphere; and (c) epitaxially growing a second silicon layer on the first silicon layer heat treated in a hydrogen atmosphere.

A method for producing an SOI substrate claimed in claim 44 of the present invention is the method of claim 43, wherein the steps (a) to (c) are performed in situ.

A method for producing an SOI substrate claimed in claim 45 of the present invention is the method of any one of claims 42 to 44, wherein the temperature of the heat treatment in a hydrogen atmosphere is not lower than 800° C. but not higher than 1,200° C.

A method for producing an SOI substrate claimed in claim 46 of the present invention is the method of any one of claims 42 to 45, further including the step of implanting silicon ions after the step of forming the first silicon layer, to make a deep portion of the silicon layer amorphous, and performing annealing for recrystallization.

A method for producing an SOI substrate claimed in claim 47 of the present invention is the method of claim 42 or 43, further including the step of implanting silicon ions after the step of heat treating the first silicon layer in a hydrogen atmosphere, to make a deep portion of the silicon layer amorphous, and performing annealing for recrystallization.

A method for producing an SOI substrate claimed in claim 48 of the present invention is the method of claim 46 or 47, wherein the annealing is performed first in a nitrogen atmosphere, and then performed in an oxidizing atmosphere.

A method for producing an SOI substrate claimed in claim 49 of the present invention is the method of claim 48, further including the step of removing a silicon oxide film by etching after the annealing in the oxidizing atmosphere.

A method for producing an SOI substrate claimed in claim 50 of the present invention is the method of claim 42, further comprising the step of applying chemical and/or mechanical polishing to the silicon layer after the step of heat treating the silicon layer in a hydrogen atmosphere.

A method for producing an SOI substrate claimed in claim 51 of the present invention is the method of claim 43, further comprising the step of applying chemical and/or mechanical polishing to the silicon layer after the step of epitaxially growing the second silicon layer.

A method for producing an SOI substrate claimed in claim 52 of the present invention is the method of any one of claims 42 to 51, wherein the step of forming the first silicon layer on the insulating layer on silicon substrate is the step of epitaxially growing the first silicon layer on the insulating layer on silicon substrate.

A method for producing an SOI substrate claimed in claim 53 of the present invention is the method of any one of claims 42 to 51, wherein the insulating layer on silicon substrate is a single crystalline oxide substrate.

A method for producing an SOI substrate claimed in claim 54 of the present invention is the method of claim 53, wherein the single crystalline oxide substrate is a sapphire substrate.

A method for producing an SOI substrate claimed in claim 55 of the present invention is the method of any one of claims 42 to 51, wherein the insulating layer on silicon substrate is a multiple-layer substrate comprising a silicon substrate as a substrate and a crystalline oxide layer or fluoride layer deposited on the silicon substrate.

A method for producing an SOI substrate claimed in claim 56 of the present invention is the method of claim 55, wherein the crystalline oxide layer comprises any of $\alpha\text{-}Al_2O_3$, $\gamma\text{-}Al_2O_3$, $\theta\text{-}Al_2O_3$, $MgO.Al_2O_3$, $CeO_2$, $SrTiO_3$, $(Zr_{1-x},Y_x)O_y$, $Pb(Zr,Ti)O_3$, $LiTaO_3$, and $LiNbO_3$, and the crystalline fluoride layer comprises $CaF_2$.

An SOI substrate claimed in claim 57 of the present invention is produced by the method of any one of claims 12 to 41.

An SOI substrate claimed in claim 58 of the present invention is produced by the method of any one of claims 42 to 56.

A semiconductor device claimed in claim 59 of the present invention is a semiconductor device having an SOI substrate used as a substrate, wherein the SOI substrate of any one of claims 1 to 11 is used as the SOI substrate, whereby device performance is improved.

A semiconductor device claimed in claim 60 of the present invention is the semiconductor device of claim 59, which is at least one of a field effect transistor and a bipolar transistor, and wherein the device performance improved by using the SOI substrate of any one of claims 1 to 11 as the SOI substrate of the semiconductor device are at least one of transconductance, cut-off frequency, flicker noise, and electrostatic discharge.

A semiconductor device claimed in claim 61 of the present invention is the semiconductor device of claim 59, which is MOSFET, and wherein the device performance improved by using the SOI substrate of any one of claims 1 to 11 as the SOI substrate of the semiconductor device are at least one of transconductance, cut-off frequency, flicker noise, electrostatic discharge, drain breakdown voltage, and dielectric breakdown charge density.

A semiconductor device claimed in claim 62 of the present invention is the semiconductor device of claim 59, which is a bipolar transistor, and wherein the device performance improved by using the SOI substrate of any one of claims 1 to 11 as the SOI substrate of the semiconductor device are at least one of transconductance, cut-off frequency, collector current, leakage current characteristics, and current gain.

A semiconductor device claimed in claim 63 of the present invention is the semiconductor device of claim 59, which is a diode, and wherein the device performance improved by using the SOI substrate of any one of claims 1 to 11 as the SOI substrate of the semiconductor device are at least one of reverse leakage current characteristics, forward bias current, and ideality factor.

A semiconductor device claimed in claim 64 of the present invention is the semiconductor device of claim 59, which is a semiconductor integrated circuit, and wherein the device performance improved by using the SOI substrate of any one of claims 1 to 11 as the SOI substrate of the semiconductor device are at least one of frequency characteristic, noise characteristic, amplification characteristic, and dissipation power characteristic.

A semiconductor device claimed in claim 65 of the present invention is the semiconductor device of claim 59, which is a semiconductor integrated circuit composed of MOSFET, and wherein the device performance improved by using the SOI substrate of any one of claims 1 to 11 as the SOI substrate of the semiconductor device are at least one of frequency characteristic, noise characteristic, amplification characteristic, and dissipation power characteristic.

A semiconductor device claimed in claim 66 of the present invention is a semiconductor device having an SOI substrate used as a substrate, wherein an SOI substrate produced by the method of any one of claims 12 to 41 is used as the SOI substrate, whereby device performance is improved.

A semiconductor device claimed in claim 67 of the present invention is a semiconductor device having an SOI substrate used as a substrate, wherein an SOI substrate produced by the method of any one of claims 42 to 56 is used as the SOI substrate, whereby device performance is improved.

A semiconductor device claimed in claim 68 of the present invention is the semiconductor device of claim 66 or 67, which is at least one of a field effect transistor and a bipolar transistor, and wherein the device performance is at least one of transconductance, cut-off frequency, flicker noise, and electrostatic discharge.

A semiconductor device claimed in claim 69 of the present invention is the semiconductor device of claim 66 or 67, which is MOSFET, and wherein the device performance is at least one of transconductance, cut-off frequency, flicker noise, electrostatic discharge, drain breakdown voltage, and dielectric breakdown charge density.

A semiconductor device claimed in claim 70 of the present invention is the semiconductor device of claim 66 or 67, which is a bipolar transistor, and wherein the device performance is at least one of transconductance, cut-off frequency, collector current, leakage current characteristics, and current gain.

A semiconductor device claimed in claim 71 of the present invention is the semiconductor device of claim 66 or 67, which is a diode, and wherein the device performance is at least one of reverse leakage current characteristic, forward bias current, and ideality factor.

A semiconductor device claimed in claim 72 of the present invention is the semiconductor device of claim 66 or 67, which is a semiconductor integrated circuit, and wherein the device performance is at least one of frequency characteristic, noise characteristic, amplification characteristic, and dissipation power characteristic.

A semiconductor device claimed in claim 73 of the present invention is the semiconductor device of claim 66 or 67, which is a semiconductor integrated circuit composed of MOSFET, and wherein the device performance is at least one of frequency characteristic, noise characteristic, amplification characteristic, and dissipation power characteristic.

A method for producing a semiconductor device claimed in claim 74 of the present invention is a method for producing a semiconductor device on an SOI substrate comprising an insulating layer on silicon substrate, and a silicon layer formed on the insulating layer on silicon substrate, comprising the steps of:
 (a) forming a first silicon layer on the insulating layer on silicon substrate;
 (b) heat treating the first silicon layer in an oxidizing atmosphere to oxidize a part of a surface side of the first silicon layer;
 (c) removing a silicon oxide film formed in the preceding step (b) by etching;

(d) epitaxially growing a second silicon layer on the remaining first silicon layer; and (e) heat treating a silicon layer, formed in the preceding step (d), in an oxidizing atmosphere to oxidize a part of a surface side of the silicon layer, and then removing a silicon oxide film, which has been formed, by etching to adjust the silicon layer to a desired thickness.

A method for producing a semiconductor device claimed in claim 75 of the present invention is the method of claim 74, further including the step of implanting silicon ions after the step of forming the first silicon layer, to make a deep portion of the silicon layer amorphous, and performing annealing for recrystallization.

A method for producing a semiconductor device claimed in claim 76 of the present invention is the method of claim 74, further comprising the step of heat treating a silicon layer in a hydrogen atmosphere after the step (d) of epitaxially growing the second silicon layer.

A method for producing a semiconductor device claimed in claim 77 of the present invention is the method of claim 74, further comprising applying chemical and/or mechanical polishing to a silicon layer before or after the step (e).

A method for producing a semiconductor device claimed in claim 78 of the present invention is a method for producing a semiconductor device on an SOI substrate comprising an insulating layer on silicon substrate, and a silicon layer formed on the insulating layer on silicon substrate, including the steps of:

(a) forming a silicon layer on the insulating layer on silicon substrate;

(b) heat treating the silicon layer in a hydrogen atmosphere; and (c) heat treating the silicon layer in an oxidizing atmosphere to oxidize a part of a surface side of the silicon layer, and then removing a silicon oxide film, which has been formed, by etching to adjust the silicon layer to a desired thickness.

A method for producing a semiconductor device claimed in claim 79 of the present invention is the method of claim 78, further including the step of implanting silicon ions after the step of forming the first silicon layer, to make a deep portion of the silicon layer amorphous, and performing annealing for recrystallization.

A method for producing a semiconductor device claimed in claim 80 of the present invention is the method of claim 78, further comprising performing chemical and/or mechanical polishing of the silicon layer before or after the step (c).

A method for producing a semiconductor device claimed in claim 81 of the present invention is a method for producing a semiconductor device on an SOI substrate comprising an insulating layer on silicon substrate, and a silicon layer formed on the insulating layer on silicon substrate, comprising the steps of:

(a) forming a first silicon layer on the insulating layer on silicon substrate;

(b) heat treating the first silicon layer in a hydrogen atmosphere;

(c) epitaxially growing a second silicon layer on the first silicon layer heat treated in a hydrogen atmosphere; and (d) heat treating a silicon layer, formed in the step (c), in an oxidizing atmosphere to oxidize a part of a surface side of the silicon layer, and then removing a silicon oxide film, which has been formed, by etching to adjust the silicon layer to a desired thickness.

A method for producing a semiconductor device claimed in claim 82 of the present invention is the method of claim 81, further including the step of implanting silicon ions after the step of forming the first silicon layer, to make a deep portion of the silicon layer amorphous, and performing annealing for recrystallization.

A method for producing a semiconductor device claimed in claim 83 of the present invention is the method of claim 81, further comprising applying chemical and/or mechanical polishing to the resulting silicon layer before or after the step (d).

BRIEF DESCRIPTION OF THE DRAWINGS

FIGS. 1A to 1D are sectional views of an SOS substrate during a manufacturing process showing a procedure for producing an SOI substrate in accordance with the invention recited in claim 13.

FIG. 6A shows an SOS substrate having a silicon layer epitaxially grown on a sapphire substrate by APCVD. FIG. 6B shows an SOS substrate produced by implanting silicon ions into the silicon layer of the substrate of FIG. 6A to make its deep portion amorphous, and then performing annealing for recrystallization. FIG. 6C shows an SOS substrate produced when the step of implanting silicon ions into a first silicon layer to make its deep portion amorphous, and then performing annealing for recrystallization was added between the step (a) and the step (b) in the invention recited in claim 13. FIG. 6D shows an SOS substrate produced when the SOS substrate of FIG. 6C was further heat treated in a hydrogen atmosphere. FIG. 6E shows an SOS substrate produced when the SOS substrate of FIG. 6B was heat treated in a hydrogen atmosphere.

BEST MODE FOR CARRYING OUT THE INVENTION

Embodiments of the present invention will be described below.

The insulating layer on silicon substrate in the present invention is a single crystalline oxide substrate, such as a sapphire substrate, or a crystalline oxide layer, such as a layer of $\alpha\text{-}Al_2O_3$, $\gamma\text{-}Al_2O_3$, $\theta\text{-}Al_2O_3$, $MgO.Al_2O_3$, $CeO_2$, $SrTiO_3$, $(Zr_{1-x},Y_x)O_y$, $Pb(Zr,Ti)O_3$, $LiTaO_3$, or $LiNbO_3$, or a crystalline fluoride layer, such as a layer of $CaF_2$, deposited on a silicon substrate as a substrate. As the insulating layer on silicon substrate, an amorphous material, such as a glass substrate, or $SiO_2$ on a silicon substrate as a substrate may also be used. No restrictions are imposed on the method for growing the oxide layer or fluoride layer on the silicon substrate. Usually, low pressure chemical vapor deposition (LPCVD), ultra-high vacuum chemical vapor deposition (UHV-CVD), molecular beam epitaxy (MBE), sputtering, or laser MBE is used. In the case of $SiO_2$, it may be the silicon substrate which has been thermally oxidized in an oxidizing atmosphere. The present invention can be similarly applied to a semiconductor substrate having an SOI structure, such as an SIMOX substrate or a bonded SOI substrate. Application of this invention to such a semiconductor substrate has the effect that a highly crystalline silicon layer with fewer crystalline defects can be obtained.

FIGS. 1A to 1D show the procedure for preparing an SOS substrate in accordance with the invention recited in claim 12 or 13.

Figure 1A:
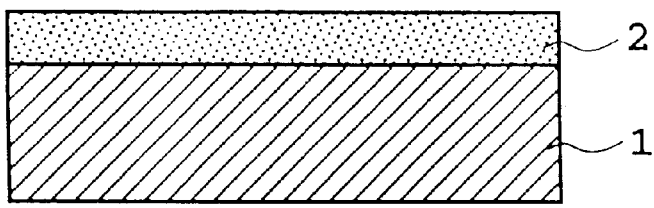
FIGS. 1A to 1C are sectional views of an SOS substrate during a manufacturing process showing a procedure for producing an SOI substrate in accordance with the invention recited in claim 12.

In the present invention, the first step is to grow a first silicon layer 2 epitaxially on a sapphire substrate 1, an insulator, as shown in FIG. 1A. Methods employed for this purpose include atmospheric pressure chemical vapor deposition (APCVD), low pressure chemical vapor deposition (LPCVD), ultra-high vacuum chemical vapor deposition (UHV-CVD), molecular beam epitaxy (MBE), and electron beam (EB) evaporation. The thickness of the first silicon layer is not restricted, but the range of 0.03 $\mu$m to 1 $\mu$m, for example, is suitable for practical use.

Figure 1B:
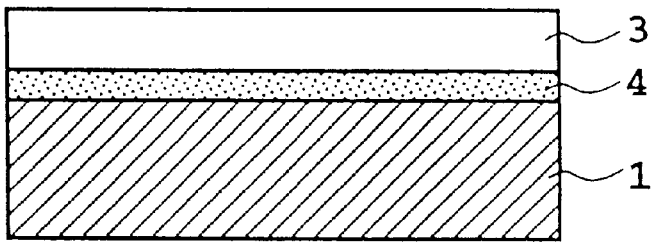

Then, the first silicon layer 2 is heat treated in an oxidizing atmosphere to form a silicon oxide layer 3 on the surface, as shown in FIG. 1B. This heat treatment results in the rearrangement of atoms, decreasing many dislocations or stacking faults due to lattice mismatch which have occurred in the first silicon layer 2 after epitaxial growth, or eliminating portions different in orientation which exist in this layer.

The temperature of the heat treatment in the oxidizing atmosphere is not lower than 500° C. but not higher than 1,350° C., preferably not lower than 600° C. but not higher than 1,300° C., more preferably not lower than 800° C. but not higher than 1,200° C. If the temperature is too low, the effect of rearranging atoms is diminished. At too high a temperature, problems occur, such that the constituent element of the substrate diffuses into the silicon layer. The atmosphere for the heat treatment is not restricted, as long as it is an oxidizing atmosphere. An oxidizing gas, such as $O_2$, $O_2+H_2$, $H_2O$ or $N_2O$, or any of these oxidizing gases diluted with an inert gas, such as $N_2$ or Ar, is usually used as the atmosphere. The gas containing $O_2+H_2$ mixed gas or containing $H_2O$ is preferred, because it obtains a greater effect in reducing crystalline defects or increasing crystallinity.

Figure 1C:
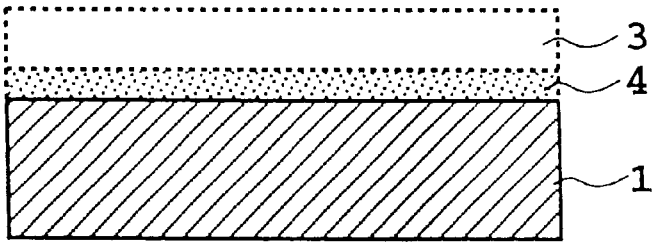

Then, as shown in FIG. 1C, the silicon oxide layer 3 is etched with hydrofluoric acid or buffered hydrofluoric acid (BHF) for its removal.

According to the invention described in claim 12, an SOS substrate is prepared in the above-described manner. Because of this procedure, the silicon layer is decreased in crystalline defects, and increased in crystallinity and orientation.

Figure 1D:
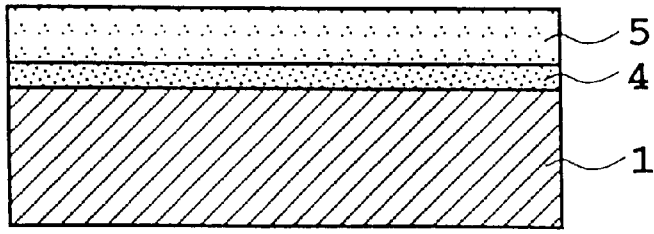

In the invention recited in claim 13, a silicon layer 4 that has remained is used as a seed layer, and a second silicon layer 5 is homoepitaxially grown on the silicon layer 4, as shown in FIG. 1D. As a method for this growth, APCVD, LPCVD, UHV-CVD, MBE, or EB evaporation is used, as for the first silicon layer 2. However, the same method as for the growth of the first silicon layer 2 need not be used.

In homoepitaxially growing the second silicon layer 5, it is important that a silicon oxide layer which inhibits epitaxial growth of silicon be absent, and should not be formed, on the surface of the seed layer at the initial stage of growth. For this purpose, it is preferred for the content of moisture or oxygen to be minimal in a growing atmosphere. The preferred method of growth is a method, such as UHV-CVD or MBE, whose base pressure without supply of the starting material is $10^{-7}$ Torr or less, and which can grow a silicon layer in an ultra-high vacuum atmosphere.

To remove a native oxide film or a chemical oxide on the seed layer 4 before homoepitaxial growth of the second silicon layer 5, it is preferred to perform heat treatment in a hydrogen atmosphere or in a vacuum.

The temperature for performing epitaxial growth of the second silicon layer 5 is usually 400° C. to 1,200° C., preferably 550° C. to 1,050° C., more preferably 650° C. to 950° C. The formation of a silicon oxide layer in the surface of the seed layer depends on the amounts of moisture and oxygen present in the growing atmosphere, and the growing temperature. The smaller the amounts of moisture and oxygen present in the growing atmosphere, the more difficult the formation of a silicon oxide layer is even at low temperatures. Thus, a method capable of growing a silicon layer in an ultra-high vacuum atmosphere, such as UHV-CVD or MBE, can perform epitaxial growth at a relatively low temperature. In this case, thermal distortion is diminished, so that a high quality crystalline silicon layer becomes easy to obtain. When the base pressure is $10^{-7}$ Torr or higher in the APCVD or LPCVD method, it is recommendable to adopt a temperature profile in which the growth temperature is raised at the initial stage of growth to suppress the formation of a silicon oxide layer, and the growth temperature is lowered, starting at a halfway stage in the growth. This is effective in carrying out satisfactory epitaxial growth.

The thickness of the seed layer (silicon layer) 4 for homoepitaxial growth of the second silicon layer 5 is not restricted, but preferably, is not less than 5 nm, but not more than 1 $\mu$m.

Deposition of the second silicon layer 5 on the seed layer is the same as in homoepitaxial growth for deposition of a silicon layer on a silicon single crystalline substrate, and so is not affected by the difference in lattice constant. In addition, this deposition has the effect of lowering the growth temperature, and improves crystallinity and surface flatness, as compared with a silicon layer resulting from conventional heteroepitaxial growth. Even in comparison with the seed layer, the second silicon layer shows a remarkable decrease in crystalline defects, and remarkable improvements in crystallinity and orientation to the silicon layer. Surprisingly, moreover, after deposition of the second silicon layer, an extremely low defect density is achieved uniformly in the entire depth direction of the silicon layer, including the seed layer portion.

Deposition of the second silicon layer on the seed layer also remarkably improves the surface flatness of the silicon layer, and achieves a decrease in its surface roughness.

In the present invention, defects or impurities having donor properties in the silicon layer can be eliminated, if the step of heat treatment in a nitrogen atmosphere is applied after the step of removing the silicon oxide film 3 by etching in claim 12, or after the step of epitaxially growing the second silicon layer 5 in claim 13. This measure is preferred in forming a highly reliable semiconductor device on an SOS substrate, as evidenced, for example, by the absence of a shift in voltage at the start of action, i.e., threshold voltage, in MOSFET. Heat treatment in an oxidizing atmosphere, if applied after the heat treatment in a nitrogen atmosphere, is more preferable, because the above effect is enhanced.

Repeating the steps of FIGS. 1B through 1D two or more times in the invention illustrated in FIGS. 1A to 1D can achieve an even more pronounced effect in decreasing defect density, improving crystallinity, and reducing surface roughness.

Figure 2A:
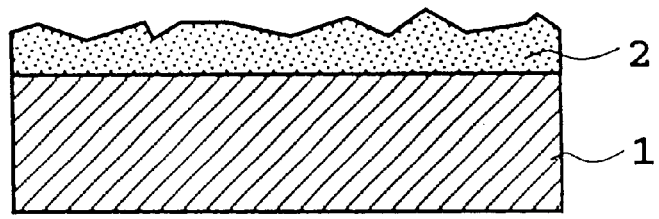
FIGS. 2A and 2B are sectional views of an SOS substrate during a manufacturing process showing a procedure for producing an SOI substrate in accordance with the invention recited in claim 42.
Figure 2B:

FIGS. 2A and 2B show the procedure for preparing an SOS substrate in accordance with the invention recited in claim 42.

In the present invention, the first step is to grow a first silicon layer 2 epitaxially on a sapphire substrate 1, an insulator, as shown in FIG. 2A. Methods employed for this purpose include APCVD, LPCVD, UHV-CVD, MBE, and EB evaporation. The silicon layer may be an amorphous silicon layer grown at a low temperature. The thickness of the silicon layer is not restricted, but the range of 0.03 $\mu$m to 1 $\mu$m, for example, is suitable for practical use.

Then, as shown in FIG. 2B, the first silicon layer 2 is heat treated in a hydrogen atmosphere. This heat treatment results in migration of silicon atoms on the surface of the silicon layer, thereby causing rearrangement of crystals, to achieve improvement in crystallinity and surface flatness.

When the temperature of the heat treatment in the hydrogen atmosphere is too low, surface migration of silicon atoms does not fully occur. If it is too high, the constituent element of the substrate (e.g., Al if the substrate is sapphire) diffuses in a large amount into the silicon layer to exert influences, such as a decrease in the crystallinity of the silicon layer, or a change in the carrier density. Thus, the temperature is 700° C. or higher, but 1,300° C. or lower, preferably 800° C. or higher, but 1,200° C. or lower.

The partial pressure of hydrogen during the heat treatment can be selected within the range of from 1 Torr to 760 Torr. The way of adjusting the partial pressure may be to draw a vacuum by means of a vacuum pump, or to dilute the hydrogen with the use of an inert gas.

The period of time for which heat treatment is performed in a hydrogen atmosphere can be selected arbitrarily. Preferably, it is 2 minutes to 5 hours, more preferably 5 minutes to 3 hours.

Figure 3A:
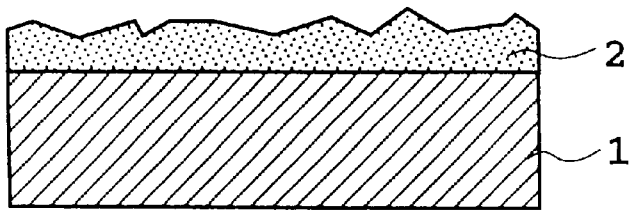
FIGS. 3A to 3C are sectional views of an SOS substrate during a manufacturing process showing a procedure for producing an SOI substrate in accordance with the invention recited in claim 43.
Figure 3B:
Figure 3B:
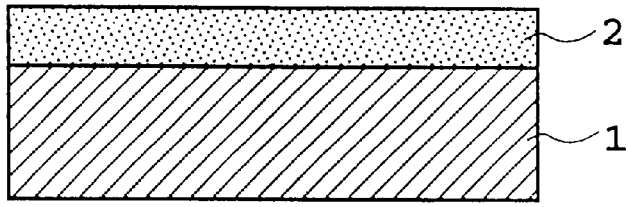
Figure 3C:
Figure 3C:
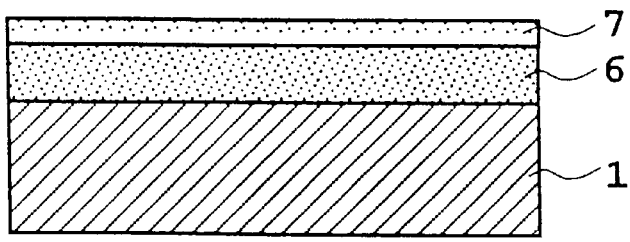

FIGS. 3A to 3C show the procedure for preparing an SOS substrate in accordance with the invention recited in claim 43.

In the present invention, as shown in FIG. 3A, the first step is to grow a first silicon layer 2 epitaxially on a sapphire substrate 1 by the same method as described earlier. The thickness of the first silicon layer 2 is not restricted, but the range of 0.03 $\mu$m to 1 $\mu$m, for example, is suitable for practical use.

Then, as shown in FIG. 3B, the first silicon layer 2 is heat treated in a hydrogen atmosphere to improve the crystallinity and surface flatness of the first silicon layer 2. Then, as shown in FIG. 3C, a second silicon layer 7 is epitaxially grown on this silicon layer, with this silicon layer as a seed layer 6.

In this case, the heat treatment in a hydrogen atmosphere, applied in situ, is preferred, because the seed layer 6 and the second silicon layer 7 grown thereon become better in quality. The in situ treatment herein means that treatment for depositing the silicon layer, and heat treatment in the hydrogen atmosphere are performed continuously in the same treating apparatus. For this purpose, it is important not to expose the silicon layer to the air halfway during the process.

The thickness of the silicon seed layer 6 is not restricted, but preferably it is 5 nm to 1 $\mu$m, more preferably 10 nm to 200 nm.

The method and conditions for growing the silicon layer, and the conditions for its heat treatment in the hydrogen atmosphere are the same as described previously.

As with the preceding invention, deposition in epitaxially growing the second silicon layer 7 on the silicon seed layer 6 is the same as in homoepitaxial growth for deposition of a silicon layer on a silicon single crystalline substrate, and so is not affected by the difference in lattice constant. In addition, this deposition has the effect of lowering the growth temperature, and improves crystallinity and surface flatness, as compared with a silicon layer resulting from conventional heteroepitaxial growth.

Figure 4A:
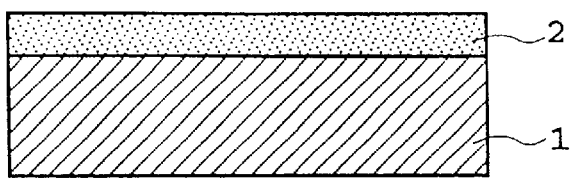
FIGS. 4A to 4F are sectional views of an SOS substrate during a manufacturing process showing a procedure for producing an SOI substrate, in which the step of implanting silicon ions into a first silicon layer to make a deep portion of the first silicon layer amorphous, and then performing annealing for recrystallization was added between the step (a) and the step (b) in the invention recited in claim 13.
Figure 4B:
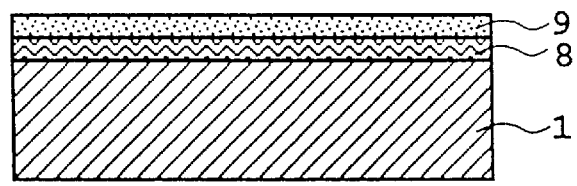
Figure 4C:
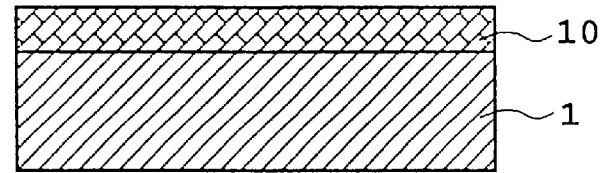
Figure 4D:
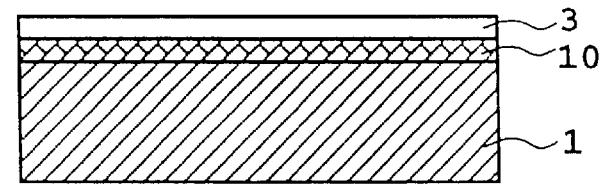
Figure 4E:
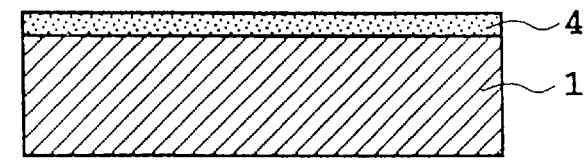
Figure 4F:
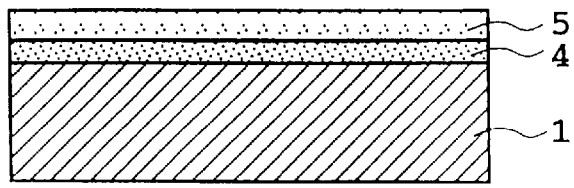

To obtain an SOS substrate with an even lower defect density in the silicon layer in the inventions recited in claims 12, 13, 42 and 43, the following steps are preferred: As shown in FIGS. 4A to 4F, a first silicon layer 2 is epitaxially grown (FIG. 4A), whereafter silicon ions are implanted into the first silicon layer 2 to make its deep portion 8 amorphous (FIG. 4B). Then, the first silicon layer 2 is annealed to form a silicon layer 10 (FIG. 4C) recrystallized, starting at a surface layer 9. The silicon layer 10 is subjected to subsequent treatments, including heat treatment in an oxidizing atmosphere (FIG. 4D) and heat treatment in a hydrogen atmosphere. The heat treatment in a hydrogen atmosphere, in particular, is very effective, because during this step, evaporation of silicon does not occur even at high temperatures, and the effect of improving the crystallinity and surface flatness of the silicon layer appears noticeably.

As an atmosphere for annealing effected for recrystallization after silicon ion implantation, it is preferred to use a nitrogen atmosphere first, and then replace it by an oxidizing atmosphere. A silicon oxide film formed by annealing in the oxidizing atmosphere is removed by etching.

The SOS substrate produced by the manufacturing procedure of the invention recited in claim 12 or 13 is heat treated in a hydrogen atmosphere, whereby an SOS substrate with good crystallinity and surface flatness can be obtained.

Figure 2B:
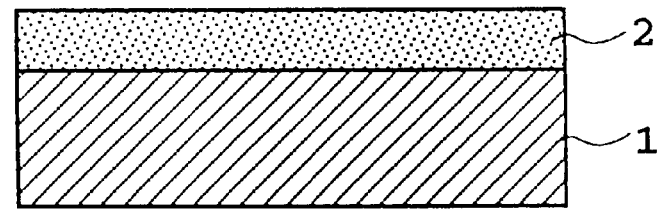

After a series of steps in FIGS. 1 to 3 are completed, the silicon layer 4 of FIG. 1C, the silicon layer 5 of FIG. 1D, the silicon layer 2 of FIG. 2B, and the silicon layer 7 of FIG. 3C are each subjected to a treatment for surface flattening, such as chemical or/and mechanical polishing. This is preferred, because it benefits the performance and reliability of the device.

In accordance with the present invention, an SOI substrate is prepared which has as an insulating layer on silicon substrate a single crystalline oxide substrate such as sapphire, or a substrate comprising a silicon substrate, and a crystalline oxide layer, such as a layer of $\alpha$-$Al_2O_3$, $\gamma$-$Al_2O_3$, $\theta$-$Al_2O_3$, $MgO.Al_2O_3$, $CeO_2$, $SrTiO_3$, $(Zr_{1-x},Y_x)O_y$, $Pb(Zr,Ti)O_3$, $LiTaO_3$, or $LiNbO_3$, or a crystalline fluoride layer, such as a layer of $CaF_2$, deposited on the silicon substrate. Each of the resulting SOI substrates was immersed in an etching solution comprising a mixture of $I_2$, KI, HF, methanol and water to form pits, and the number of pits per unit area was counted using a scanning electron microscope (SEM). By this method, the defect density of the silicon layer was measured. All the SOI substrates gave smaller values than $4 \times 10^8/cm^2$.

Figure 5:
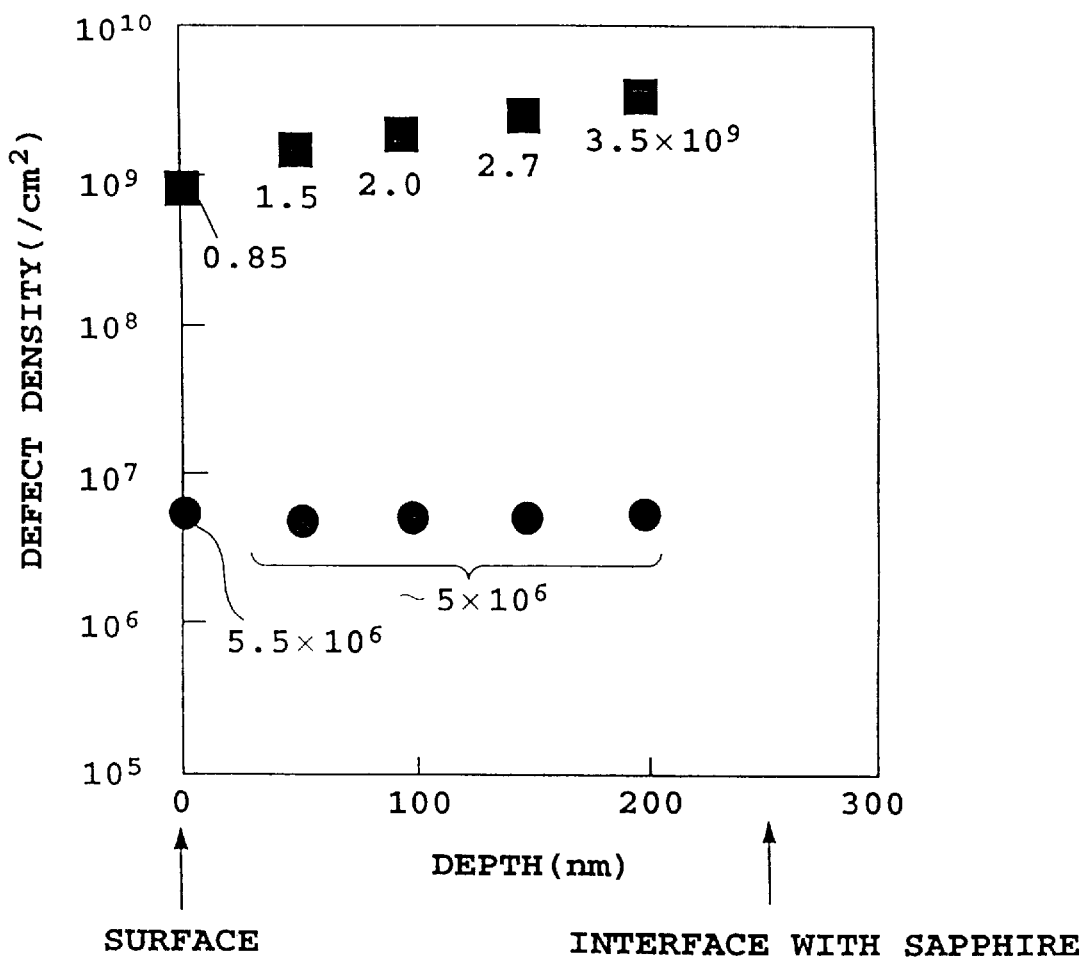
FIG. 5 is a graph showing that the defect density is low in the entire thickness direction of the silicon layer in the SOI substrate subjected to the step of performing annealing for recrystallization.

There is also an SOI substrate prepared when the step of implanting silicon ions into a first silicon layer to make a deep portion of the first silicon layer amorphous, and then annealing it to recrystallize it, beginning at the surface layer, is added between the step (a) and the step (b) in the invention recited in claim 13. This SOI substrate gives a crystalline defect density of $10^7/cm^2$ or less in the entire depth direction of the silicon layer, as shown in FIG. 5, even when the thickness of the silicon layer is as small as 0.1 $\mu$m to 0.3 $\mu$m. The SOI substrate also has the following properties: the full width at half maximum of an X-ray diffraction rocking curve of a (004)-peak in the silicon layer grown parallel to the substrate surface is about 700 arcsec, the lattice constants of a-silicon (100)-plane perpendicular to the substrate surface and the silicon (001)-plane parallel to the substrate surface are about 5.43 angstroms, the ratio of the lattice constant of the silicon (001)-plane to the lattice constant of the silicon (100)-plane is not more than 1.005 but not less than 0.995, and the ratio of the intensity of the 220-reflection to the intensity of a 004-reflection parallel to the substrate surface in X-ray diffraction measurement is 0.1 or less.

When heat treatment in a hydrogen atmosphere is applied after the step of epitaxial growth of the second silicon layer in such SOI substrate, crystalline defects are further decreased, the full width at half maximum of the X-ray diffraction rocking curve of the (004)-peak becomes even smaller.

FIGS. 6A to 6E are photographs showing the results of observation by SEM of various SOS substrates after treatment with the aforementioned etching solution to form pits in the silicon layer.

Figure 6A:
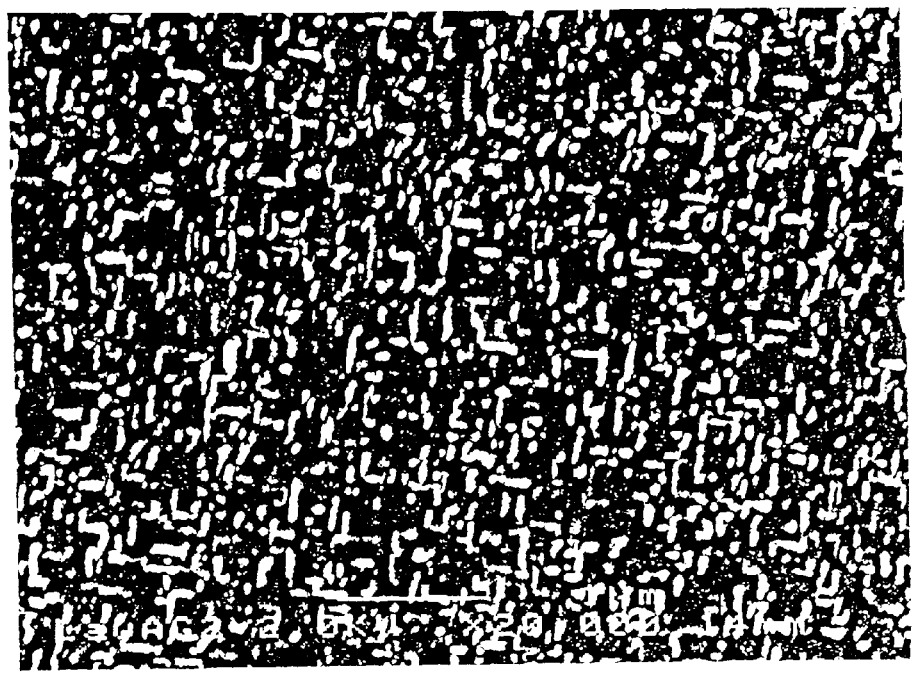
FIGS. 6A to 6E are photographs showing the results of observation by SEM of various SOS substrates after treatment with an etching solution to form pits.
Figure 6B:
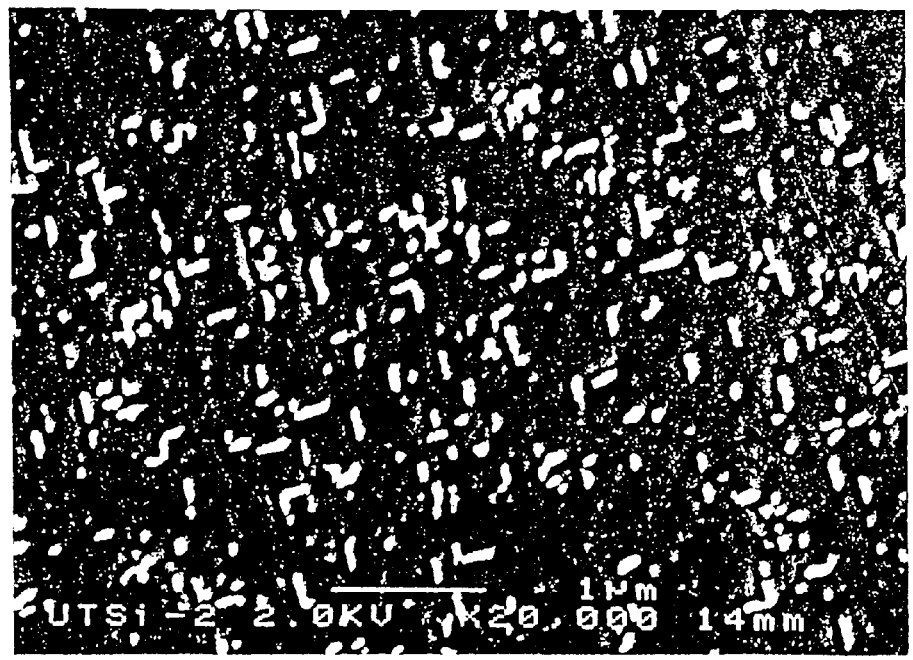
Figure 6C:
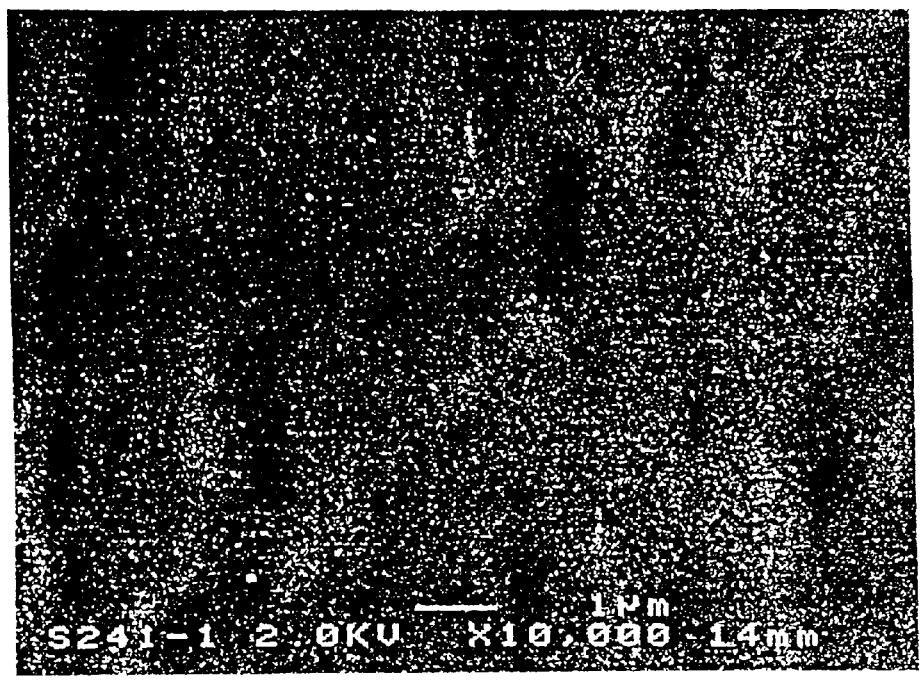
Figure 6D:
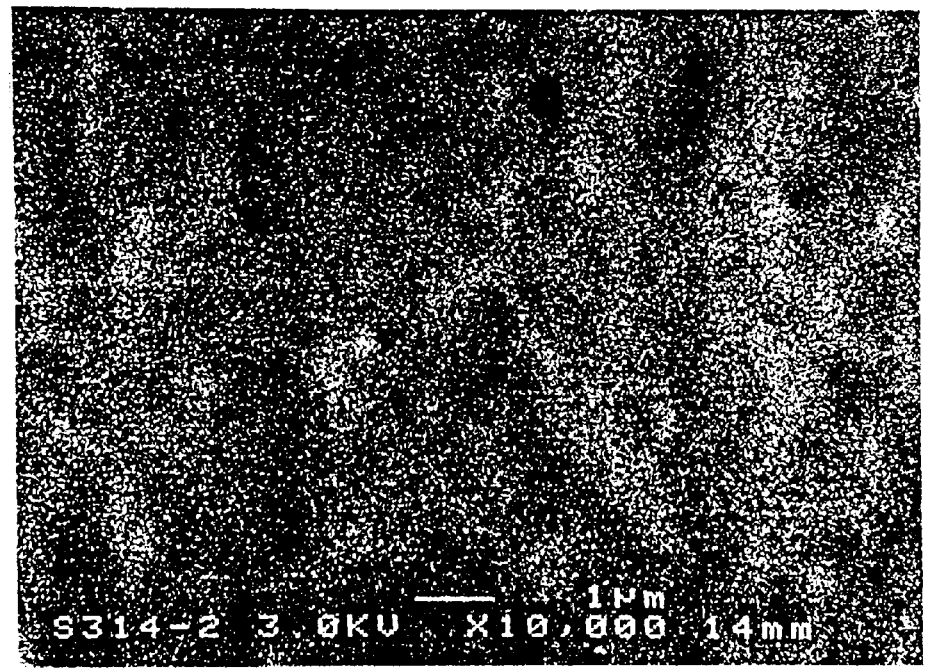
Figure 6E:
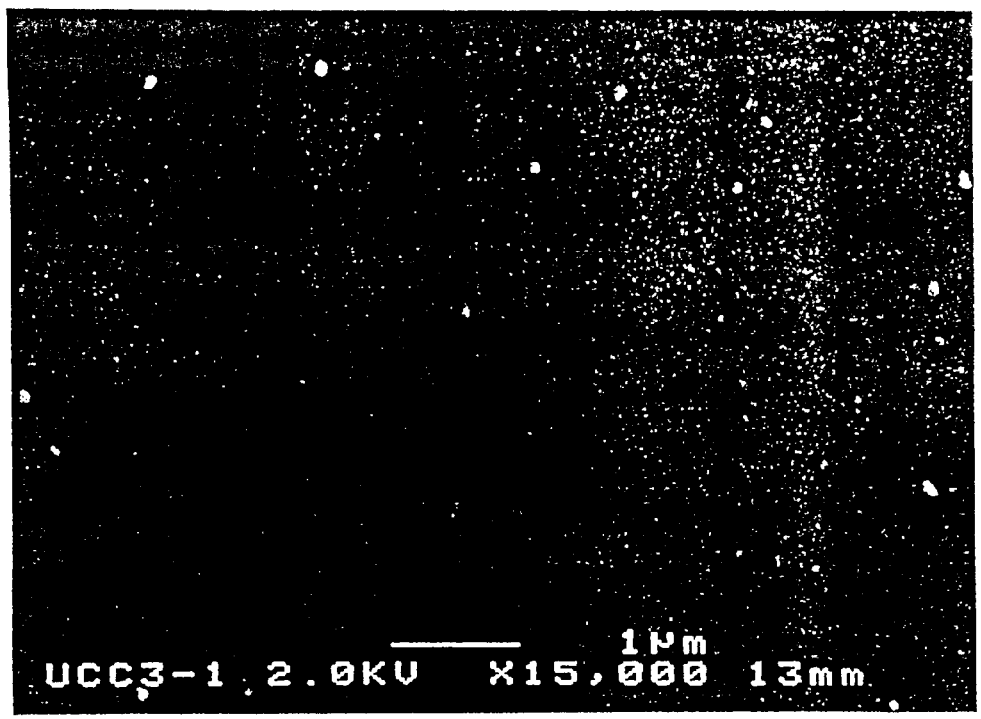

Many pits ascribed to crystalline defects with a density of $10^9/cm^2$ or more are observed in an SOS substrate produced by an earlier technology, i.e., an SOS substrate having a first silicon layer epitaxially grown on a sapphire substrate by APCVD (FIG. 6A), or in an SOS substrate produced by implanting silicon ions into the first silicon layer of the substrate of FIG. 6A to make its deep portion amorphous, and then annealing the first silicon layer to recrystallize it, beginning at the surface layer (FIG. 6B). Few pits are noted, on the other hand, in an SOS substrate (FIG. 6C) produced when the step of implanting silicon ions into a first silicon layer to make its deep portion amorphous, and then performing annealing for recrystallization is added between the step (a) and the step (b) in the invention recited in claim 13; or in an SOS substrate (FIG. 6D) produced when the SOS substrate of FIG. 6C is further heat treated in a hydrogen atmosphere. Particularly in FIGS. 6A and 6B, line-shape pits caused by stacking faults, which adversely affect device performance, appear in large numbers. In FIGS. 6C and 6D, there are none of such line-shape pits, demonstrating the significant effect of the present invention.

Nor are there line-shape pits caused by stacking faults in an SOS substrate (FIG. 6E) produced when applying heat treatment in a hydrogen atmosphere to an SOS substrate subjected to the step of implanting silicon ions into a first silicon layer to make its deep portion amorphous, and then annealing the first silicon layer to recrystallize it, beginning at the surface layer. This is also proof of the effect of the present invention.

There is also an SOI substrate prepared when the step of implanting silicon ions into a first silicon layer to make its deep portion amorphous, and then annealing it to recrystallize it, beginning at the surface layer, is performed between the step (a) and the step (b) in the invention recited in claim 43. This SOI substrate gives a defect density of $10^7/cm^2$ or less in the entire depth direction of the silicon layer, even when the thickness of the silicon layer is as small as 0.1 $\mu$m to 0.3 $\mu$m. The SOI substrate also has the following properties: the full width at half maximum of an X-ray diffraction rocking curve of a (004)-peak in the silicon layer grown parallel to the substrate surface is about 700 arcsec, the lattice constants of a silicon (100)-plane perpendicular to the substrate surface and a silicon (001)-plane parallel to the substrate surface are about 5.43 angstroms, the ratio of the lattice constant of the (001)-plane to the lattice constant of the (100)-plane is not more than 1.005 but not less than 0.995, and the ratio of the intensity of a 220-reflection to the intensity of a 004-reflection parallel to the substrate surface in X-ray diffraction measurement is 0.1 or less.

In the present invention, the surface roughness refers to roughness root mean square, Rrms, in the range 10 $\mu$m$\times$10 $\mu$m determined using an atomic force microscope. The surface roughnesses of the SOI substrates prepared by the present invention were all not more than 4 nm.

In accordance with the present invention, a silicon layer with very few crystalline defects and with satisfactory flatness can be prepared on a single crystalline oxide substrate, such as a substrate of sapphire, or a crystalline oxide layer, such as a layer of $\alpha$-$Al_2O_3$, $\gamma$-$Al_2O_3$, $\theta$-$Al_2O_3$, $MgO.Al_2O_3$, $CeO_2$, $SrTiO_3$, $(Zr_{1-x},Y_x)O_y$, $Pb(Zr,Ti)O_3$, $LiTaO_3$, or $LiNbO_3$, or a crystalline fluoride layer, such as a layer of $CaF_2$, deposited on a silicon substrate as a substrate. Thus, a semiconductor device having excellent performance unobtainable with the conventional SOI substrate composed of the same materials can be formed on the SOI substrate of the invention.

The semiconductor device of the present invention is obtained by incorporating into the manufacturing method a preliminary step for improving the quality of an SOI substrate, a step aimed at improving the crystallinity and surface flatness of the substrate, as described in claims 74 to 83. Subsequent steps may be the same as in the earlier technologies.

The semiconductor device in the present invention is not restricted in terms of type, and includes all silicon devices, such as MOSFET, bipolar transistor, BiCMOS transistor as a combination of them, thin film transistor (TFT), diode, and solar cell. Integrated circuits composed of MOSFET and any of these devices may also be included.

When MOSFET is formed on an SOS substrate, for example, the silicon layer of the invention in which the MOSFET is formed is decreased in crystalline defect density and surface roughness, satisfactory in orientation, and minimal in distortion. Thus, when carriers move through channels, there is little scattering, and effective mobility and transconductance are high.

Flicker noise is said to be attributable to fluctuations in mobility of moving carriers when scattered by crystalline defects in the silicon layer; or to trapping and detrapping which the moving carriers undergo via traps generated at the interface between the silicon layer with surface roughness and a gate oxide film formed thereon. By decreasing the crystalline defects and surface roughness of the silicon layer, low flicker noise can be achieved.

When a gate oxide film constituting MOSFET is to be prepared by thermal oxidation of a silicon layer, the thickness of an $SiO_2$ film after thermal oxidation becomes nonuniform, or pinholes or weak spots are included in the film, if the crystalline defect density or surface roughness is great as in the earlier technologies. This induces a drop in dielectric breakdown voltage. In the present invention, the silicon layer forming MOSFET has a low crystalline defect density and small surface roughness. Thus, defects in the $SiO_2$ film after thermal oxidation are few, and the breakdown voltage of gate oxide is markedly high.

Furthermore, because of the reduction in the defect density of the silicon layer forming MOSFET, electric current passage through defects is minimal, even if a high voltage such as static electricity is applied. Hence, higher ESD than before can be obtained.

In addition, SOI structures, which the present invention is directed to, have been higher in the drain breakdown voltage of MOSFET than a bonded SOI substrate and an SIMOX substrate with $SiO_2$ as an underlying layer for a silicon layer. The present invention reduces crystalline defects in the silicon layer, and decreases a leakage current between the source and the drain. Furthermore, during heat treatment at a high temperature, Al, the constituent element of the base, diffuses into the silicon layer to form a killer level for hot carriers in the vicinity of the interface. As a result, less hot carriers accumulate at the body portion, thus obtaining an even higher drain breakdown voltage.

As described above, an integrated circuit composed of MOSFET having high performance and high reliability on an SOS substrate can exhibit much better characteristics than before, such as a high operating speed, a low noise, and high reliability, under the same design rules. Hence, this integrated circuit can be used for high frequency parts for mobile communication, LSI's for satellites, analog/digital converters (ADC, DAC), LSI's for optical transmission, analog/digital mixed LSI's, and other various applications, and is a very useful device.

Working examples of the present invention will be described below.

EXAMPLE 1

A 200 nm thick first silicon layer was deposited on an R-plane sapphire substrate at a growth temperature of 950° C. by LPCVD using monosilane ($SiH_4$) gas as a starting material.

Then, the composite was introduced into an oxidation furnace, where it was steam oxidized at 1,000° C. for 30 minutes, with 180 liters/min of hydrogen and 180 liters/min of oxygen being introduced. The treated composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material, to prepare a desired SOS substrate. After growth, the total film thickness of silicon was measured, and found to be 200 nm.

To evaluate the crystallinity of the resulting SOS substrate, a part of this substrate was treated by a procedure described below to form etch pits. Then, the number of pits per unit area was measured with a scanning electron microscope (SEM) to determine the crystalline defect density.

(1) Cleaning the substrate in methanol with supersonic wave.

(2) Removing a native oxide film on the surface with the use of a 2% aqueous solution of HF.

(3) Overflowing with deionized water.

(4) Immersing the substrate for 45 seconds in an etching solution prepared at the following mixing ratio: $I_2$ (4 g), KI (12 g), methanol (40 cc), $H_2O$ (40 cc) and HF (3 cc).

(5) Overflowing with deionized water, and then repeat (2) and (3).

The defect density was found to be $3.0 \times 10^7 / cm^2$.

The surface flatness of the resulting SOS substrate was measured with AFM (atomic force microscope). The Rrms in the range 10 $\mu m \times 10$ $\mu m$ was 1.5 nm.

The orientation, crystallinity, and distortion of the resulting SOS film were evaluated using HR-XRD (high resolution four-axis X-ray diffraction) using a $K\alpha 1$ beam of Cu as a radiation source.

First, the XRC (X-ray rocking curve) of an Si (004)-plane grown parallel to the substrate surface was measured, and FWHM (full width at half maximum) was found to be 974 arcsec. The Bragg diffraction angle of the Si (004)-plane was 68.995 degrees, from which the lattice constant of Si in a direction parallel to the substrate surface was calculated at 5.440 Å.

Similarly, the diffraction of an Si {220}-plane grown parallel to the substrate surface was also measured. Normally, an Si (001)-plane grows on a sapphire R-plane. A closer look, however, shows that a small amount of phases different in orientation, such as the Si {220}-plane, also grows at the initial stage of growth, depending on problems, such as a great difference in lattice constant between sapphire and Si. These phases different in orientation may be a cause of a decrease in the crystallinity of the film, and thus should preferably be minimized. A comparison of the intensities of their diffraction peaks in X-ray diffraction serves as an index of volume ratio of phases different in orientation.

For the SOS film prepared in Example 1, the diffraction intensities of the 004-reflection and the 220-reflection of Si parallel to the substrate surface were compared. The intensity ratio turned out to be Si {220}/Si (004)=0.052.

Likewise, the diffraction of an Si (400)-plane grown perpendicularly to the substrate surface was also measured. The Bragg diffraction angle of the Si (400)-plane was 69.392 degrees, from which the lattice constant of Si in a direction perpendicular to the substrate surface was calculated at 5.413 Å. Thus, the ratio of the lattice constant in the direction parallel to the substrate surface to the lattice constant in the direction perpendicular to the substrate surface was found to be 1.0050.

Figure 7:
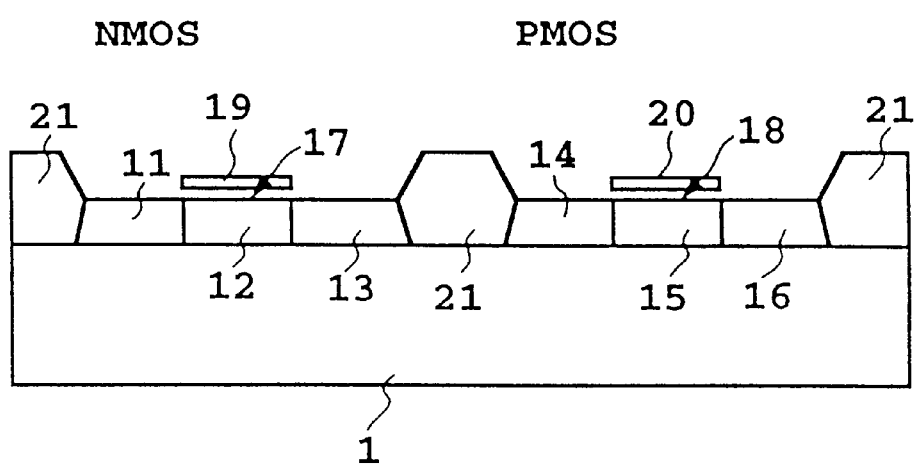
FIG. 7 is a sectional drawing of a CMOS transistor produced with the use of an SOS substrate prepared in Example 1 of the present invention.

Then, a CMOS transistor was prepared on this SOS substrate. FIG. 7 shows a section of the device. The left-hand part of the drawing indicates an NMOS portion, while the right-hand part indicates a PMOS portion. The reference numeral 1 denotes a sapphire substrate. A silicon layer was heat treated in an oxidizing atmosphere to oxidize a portion of a surface side of the silicon layer. Then, the resulting silicon oxide film was removed by etching to adjust the film thickness to 110 nm. To separate NMOS and PMOS by an insulating region, the silicon layer was oxidized such that its oxide film 21 would reach the sapphire substrate. As a result, regions surrounded with the silicon oxide film were formed on the sapphire substrate to define NMOS and PMOS. In the drawing, the numerals 17, 18 denote gate oxide films formed on the Si layer by thermal oxidation, while the numerals 19, 20 denote polysilicon gate electrodes formed on the gate oxide films. The numerals 11 and 13 denote source and drain areas of the NMOS formed by implanting arsenic ions into the silicon layer. The numerals 14 and 16 denote source and drain areas of the PMOS formed by implanting boron fluoride ions into the silicon layer. The numerals 12 and 15 denote channel portions of the NMOS and PMOS, respectively.

The device performance of the thus prepared MOS transistor was measured. In the NMOS with a gate width of 50 microns, a gate length of 0.8 micron, and a threshold voltage of 0.65 V, the transconductance was 450 $\mu$S, and the drain breakdown voltage was 8 V. The noise characteristic of this transistor was evaluated by input gate voltage spectral density (SVG). At a measuring frequency of 100 Hz, the SVG was $2\times10^{-12}V^2/Hz$. The ESD of this transistor was measured by a method complying with EIAJ ED-4701-1 Testing Method C-111A Static Electricity Damage Test, and was found to be 2,500 V.

To measure radio frequency characteristics, the cut-off frequency was measured using the NMOS with a threshold of 0.25 V, a gate width of 101 microns, and an effective gate length of 0.7 micron. It was found to be 5.4 GHz.

To evaluate the reliability of the gate oxide film, moreover, dielectric breakdown charge density (Qbd) was measured by using a gate capacitor with an oxide film thickness of 12 nm and a size of 100 $\mu$m square, and applying constant-current stress of 10 mA/cm$^2$. The Qbd was 1.0 C/cm$^2$.

COMPARATIVE EXAMPLE 1

A 200 nm thick SOS substrate was prepared on an R-plane sapphire substrate at a growth temperature of 950° C. by LPCVD using monosilane (SiH$_4$) gas as a starting material.

The defect density was measured in the same manner as in Example 1, and found to be $2.0\times10^9/cm^2$.

Similarly, the Rrms was measured with AFM, and found to be 5.0 nm.

The crystallographic properties were evaluated using HR-XRD by the same methods as in Example 1. The FWHM of the XRC of an Si (004)-plane was 2,174 arcsec. The lattice constant in a direction parallel to the substrate surface, and that in a direction perpendicular to the substrate surface were 5.444 Å and 5.403 Å, respectively. Thus, the ratio of these lattice constants was 1.0075.

Similarly, the diffraction intensities of the Si (004)-plane and Si {220}-plane parallel to the substrate surface were compared. The ratio of these diffraction intensities was Si {220}/Si (004)=0.104.

Figure 8A:
FIG. 8A is a photograph by TEM of a section of a substrate for observing the defect density of a silicon layer of an SOS substrate prepared in Comparative Example 1 of the present invention.

Furthermore, a part of this SOS substrate was cut out, and a section of this substrate was observed in an Si<110> direction under a transmission electron microscope (TEM). As shown in FIG. 8A, many stacking faults were confirmed to exist throughout the silicon layer.

Besides, an NMOS transistor and a capacitor of the same sizes as in Example 1 were prepared in the same manner as in Example 1 for evaluation of the respective items. Their device performance was evaluated by the same methods as in Example 1.

The transconductance was 250 $\mu$S, the drain breakdown voltage was 6.0 V, the SVG was $3\times10^{-10}V^2/Hz$, and the ESD was 1,500 V. The radio frequency characteristics were also evaluated similarly, showing the cut-off frequency to be 3.5 GHz. The Qbd of the gate oxide film was 0.02 C/cm$^2$.

EXAMPLE 2

A 200 nm thick first silicon layer was deposited on an R-plane sapphire substrate at a growth temperature of 950° C. by LPCVD using monosilane (SiH$_4$) gas as a starting material.

Then, the composite was introduced into an oxidation furnace, where it was steam oxidized at 1,000° C. for 30 minutes, with 180 liters/min of hydrogen and 180 liters/min of oxygen being introduced. The treated composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane (Si$_2$H$_6$) as a starting material. The thickness of the silicon layer was 200 nm.

Further, as in the above-described steps, the composite was introduced into an oxidation furnace, where it was steam oxidized at 1,000° C. for 30 minutes, with 180 liters/min of hydrogen and 180 liters/min of oxygen being introduced. The treated composite was immersed in BHF to remove an oxide film on the silicon layer which had been formed in the previous step. Then, the thickness of the remaining seed silicon layer was measured, and found to be 100 nm.

Then, a third silicon layer was similarly deposited on the seed silicon layer at a growth temperature of 750° C. by UHV-CVD using disilane (Si$_2$H$_6$) as a starting material, to prepare a desired SOS substrate. After growth, the total film thickness of silicon was measured, and found to be 200 nm.

The defect density was measured in the same manner as in Example 1, and found to be $7.5\times10^6/cm^2$. Similarly, the Rrms was measured with AFM, and found to be 1.0 nm.

The crystallographic properties were evaluated using HR-XRD by the same methods as in Example 1. The FWHM of the XRC of an Si (004)-plane was 690 arcsec. The lattice constant in a direction parallel to the substrate surface, and that in a direction perpendicular to the substrate surface were 5.438 Å and 5.420 Å, respectively. Thus, the ratio of these lattice constants was 1.0033.

Similarly, the diffraction intensities of the Si (004)-plane and Si {220}-plane parallel to the substrate surface were compared. The ratio of these diffraction intensities was Si {220}/Si (004)=0.044.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 470 $\mu$S, the drain breakdown voltage was 8.1 V, the SVG was $1.2\times10^{-12}V^2/Hz$, and the ESD was 2,700 V. The radio frequency characteristics were also evaluated similarly, showing the cut-off frequency to be 5.9 GHz. The Qbd of the gate oxide film was 1.8 C/cm$^2$.

EXAMPLE 3

A 200 nm thick first silicon layer was deposited on an R-plane sapphire substrate at a growth temperature of 950° C. by LPCVD using monosilane (SiH$_4$) gas as a starting material.

The silicon layer was implanted with $1\times10^{16}/cm^2$ of silicon ions having an energy of 190 keV, with the substrate being kept at a temperature of 0° C., to make the deep portion of the silicon layer amorphous. Then, the composite was heat treated in a nitrogen atmosphere at a temperature of 550° C. for 1 hour, and then at a temperature of 900° C. for 1 hour, to recrystallize the silicon layer.

Then, the treated composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material, to prepare a desired SOS substrate. After growth, the total film thickness of silicon was measured, and found to be 200 nm.

The defect density was measured in the same manner as in Example 1, and found to be $8.8 \times 10^6/cm^2$. Similarly, the Rrms was measured with AFM, and found to be 1.1 nm.

The crystallographic properties were evaluated using HR-XRD by the same methods as in Example 1. The FWHM of the XRC of an Si (004)-plane was 699 arcsec. The lattice constant in a direction parallel to the substrate surface, and that in a direction perpendicular to the substrate surface were 5.438 Å and 5.413 Å, respectively. Thus, the ratio of these lattice constants was 1.0046.

Similarly, the diffraction intensities of the Si (004)-plane and Si {220}-plane parallel to the substrate surface were compared. The ratio of these diffraction intensities was Si {220}/Si (004)=0.048.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 460 μS, the drain breakdown voltage was 8.1 V, the SVG was $1.5 \times 10^{-12} V^2/Hz$, and the ESD was 2,700 V. The radio frequency characteristics were also evaluated similarly, showing the cut-off frequency to be 5.8 GHz. The Qbd of the gate oxide film was 1.5 $C/cm^2$.

EXAMPLE 4

A 200 nm thick first silicon layer was deposited on an R-plane sapphire substrate at a growth temperature of 950° C. by LPCVD using monosilane ($SiH_4$) gas as a starting material.

Then, the composite was heat treated at 1,100° C. for 30 minutes in a hydrogen atmosphere at a pressure of 80 Torr.

The silicon layer was implanted with $1 \times 10^{16}/cm^2$ of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour, to recrystallize the silicon layer.

Then, the treated composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material, to prepare a desired SOS substrate. After growth, the total film thickness of silicon was measured, and found to be 200 nm.

The defect density was measured in the same manner as in Example 1, and found to be $6.2 \times 10^6/cm^2$. Similarly, the Rrms was measured with AFM, and found to be 0.9 nm.

The crystallographic properties were evaluated using HR-XRD by the same methods as in Example 1. The FWHM of the XRC of an Si (004)-plane was 670 arcsec. The lattice constant in a direction parallel to the substrate surface, and that in a direction perpendicular to the substrate surface were 5.438 Å and 5.436 Å, respectively. Thus, the ratio of these lattice constants was 1.0004.

Similarly, the diffraction intensities of the Si (004)-plane and Si {220}-plane parallel to the substrate surface were compared. The ratio of these diffraction intensities was Si {220}/Si (004)=0.036.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 475 μS, the drain breakdown voltage was 8.2 V, the SVG was $1.2 \times 10^{-12} V^2/Hz$, and the ESD was 2,800 V. The radio frequency characteristics were also evaluated similarly, showing the cut-off frequency to be 5.9 GHz. The Qbd of the gate oxide film was 1.7 $C/cm^2$.

EXAMPLE 5

A 200 nm thick first silicon layer was deposited on an R-plane sapphire substrate at a growth temperature of 950° C. by LPCVD using monosilane ($SiH_4$) gas as a starting material.

The silicon layer was implanted with $1 \times 10^{16}/cm^2$ of silicon ions having an energy of 190 keV, with the substrate being kept at a temperature of 0° C., to make the deep portion of the silicon layer amorphous. Then, the composite was heat treated in a nitrogen atmosphere at a temperature of 550° C. for 1 hour, and then at a temperature of 900° C. for 1 hour, to recrystallize the silicon layer.

Then, the treated composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material.

Then, the composite was heat treated at 1,100° C. for 30 minutes in a hydrogen atmosphere at a pressure of 80 Torr to prepare a desired SOS substrate.

The total film thickness of the resulting silicon layer was measured, and found to be 200 nm.

The defect density was measured in the same manner as in Example 1, and found to be $6.6 \times 10^6/cm^2$. Similarly, the Rrms was measured with AFM, and found to be 0.8 nm.

The crystallographic properties were evaluated using HR-XRD by the same methods as in Example 1. The FWHM of the XRC of an Si (004)-plane was 665 arcsec. The lattice constant in a direction parallel to the substrate surface, and that in a direction perpendicular to the substrate surface were 5.438 Å and 5.435 Å, respectively. Thus, the ratio of these lattice constants was 1.0005.

Similarly, the diffraction intensities of the Si (004)-plane and Si {220}-plane parallel to the substrate surface were compared. The ratio of these diffraction intensities was Si {220}/Si (004)=0.042.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 480 μS, the drain breakdown voltage was 8.3 V, the SVG was $1.0 \times 10^{-12} V^2/Hz$, and the ESD was 2,800 V. The radio frequency characteristics were also evaluated similarly, showing the cut-off frequency to be 6.0 GHz. The Qbd of the gate oxide film was 1.8 C/cm².

EXAMPLE 6

On a silicon (100) substrate, γ-$Al_2O_3$ was deposited at a substrate temperature of 880° C. by UHV-CVD using trimethyl aluminum and oxygen as starting materials. A film after growth was observed using RHEED (reflection high energy electron diffraction) and XRD. Growth of single crystalline γ-$Al_2O_3$ was confirmed.

On the γ-$Al_2O_3$ layer, a 200 nm thick first silicon layer was deposited at a growth temperature of 950° C. by UHV-CVD using disilane ($Si_2H_6$) as a starting material.

Then, the treated composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material to prepare a desired SOS substrate.

The defect density was measured in the same manner as in Example 1, and found to be $3.2 \times 10^8$/cm². Similarly, the Rrms was measured with AFM, and found to be 2.3 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 400 μS, the drain breakdown voltage was 7.5 V, the SVG was $5.2 \times 10^{-12} V^2/Hz$, and the ESD was 2,200 V. The radio frequency characteristics were also evaluated similarly, showing the cut-off frequency to be 4.8 GHz. The Qbd of the gate oxide film was 0.5 C/cm².

COMPARATIVE EXAMPLE 2

On a silicon (100) substrate, γ-$Al_2O_3$ was deposited at a substrate temperature of 880° C. by UHV-CVD using trimethyl aluminum and oxygen as starting materials. A film after growth was observed using RHEED and XRD. Growth of single crystalline γ-$Al_2O_3$ was confirmed.

On the γ-$Al_2O_3$ layer, a 200 nm thick silicon layer was deposited at a growth temperature of 950° C. by UHV-CVD using disilane ($Si_2H_6$) as a starting material to prepare an SOI substrate.

The defect density was measured in the same manner as in Example 1, and found to be $2.7 \times 10^9$/cm². Similarly, the Rrms was measured with AFM, and found to be 4.8 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 260 μS, the drain breakdown voltage was 6.2 V, the SVG was $3.1 \times 10^{-10} V^2/Hz$, and the ESD was 1,500 V. The radio frequency characteristics were also evaluated similarly, showing the cut-off frequency to be 3.5 GHz. The Qbd of the gate oxide film was 0.03 C/cm².

COMPARATIVE EXAMPLE 3

A 200 nm thick first silicon layer was deposited on an R-plane sapphire substrate at a growth temperature of 950° C. by LPCVD using monosilane ($SiH_4$) gas as a starting material.

The silicon layer was implanted with $1 \times 10^{16}$/cm² of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour, for recrystallization of the silicon layer, to prepare an SOS substrate.

The defect density was measured in the same manner as in Example 1, and found to be $1.5 \times 10^9$/cm². Similarly, the Rrms was measured with AFM, and found to be 4.3 nm.

The crystallographic properties were evaluated using HR-XRD by the same methods as in Example 1. The FWHM of the XRC of an Si (004)-plane was 1,110 arcsec. The lattice constant in a direction parallel to the substrate surface, and that in a direction perpendicular to the substrate surface were 5.444 Å and 5.406 Å, respectively. Thus, the ratio of these lattice constants was 1.0070.

Similarly, the diffraction intensities of the Si (004)-plane and Si {220}-plane parallel to the substrate surface were compared. The ratio of these diffraction intensities was Si {220}/Si (004)=0.102.

Figure 8B:
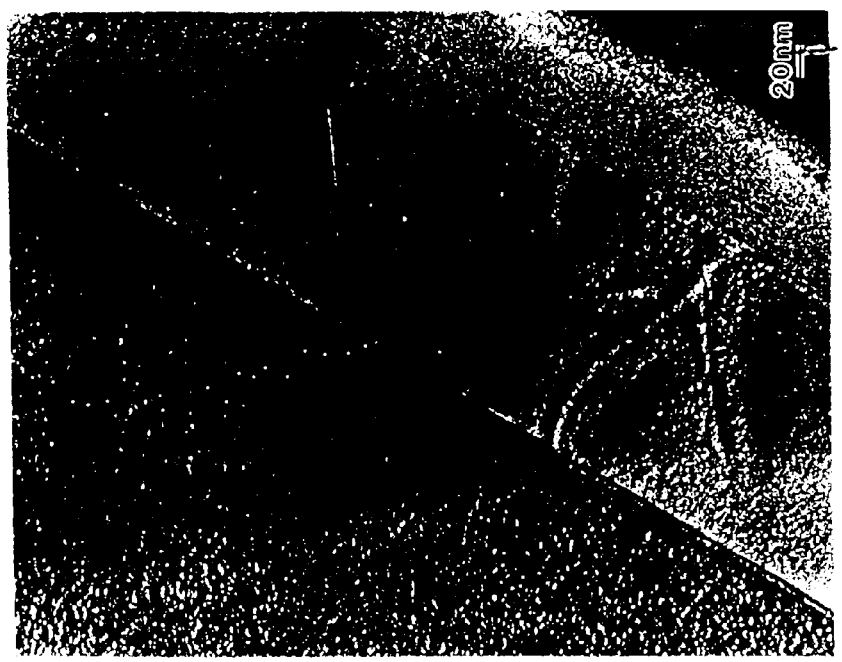
FIG. 8B is a photograph by TEM of a section of a substrate for observing the defect density of a silicon layer of an SOS substrate prepared in Comparative Example 3 of the present invention.

A part of this SOS substrate was cut out, and a section of this substrate was observed in an Si<110> direction under a transmission electron microscope (TEM) As shown in FIG. 8B, stacking faults were confirmed to exist within the silicon layer.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 350 μS, the drain breakdown voltage was 7.0 V, the SVG was $1.0 \times 10^{-10} V^2/Hz$, and the ESD was 1,800 V. The radio frequency characteristics were also evaluated similarly, showing the cut-off frequency to be 4.2 GHz. The Qbd of the gate oxide film was 0.1 C/cm².

EXAMPLE 7

A 200 nm thick first silicon layer was deposited on an R-plane sapphire substrate at a growth temperature of 950° C. by LPCVD using monosilane ($SiH_4$) gas as a starting material.

The silicon layer was implanted with $1 \times 10^{16}$/cm² of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour, for recrystallization of the silicon layer.

Then, the treated composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, the resulting SOS substrate was introduced into a UHV-CVD reactor, and was heat treated in a vacuum for 30 minutes at 900° C. Subsequently, the surface of the film was observed using RHEED in situ. When an electron beam was incident in an Si<110> direction, streaks having a clear double long period structure were seen. Thus, the seed silicon layer was confirmed to have a clean, smooth silicon surface.

Then, a second silicon layer was deposited in situ on the seed silicon layer using disilane ($Si_2H_6$) as a starting material at a growth temperature of 750° C. to prepare a desired SOS substrate. After growth, the total film thickness of silicon was measured, and found to be 200 nm.

The defect density was measured in the same manner as in Example 1, and found to be $5.0 \times 10^5 /cm^2$. Similarly, the Rrms was measured with AFM, and found to be 0.9 nm.

The crystallographic properties were evaluated using HR-XRD by the same methods as in Example 1. The FWHM of the XRC of an Si (004)-plane was 653 arcsec. The lattice constant in a direction parallel to the substrate surface, and that in a direction perpendicular to the substrate surface were 5.436 Å and 5.434 Å, respectively. Thus, the ratio of these lattice constants was 1.0004. Similarly, the diffraction intensities of the Si (004)-plane and Si {220}-plane parallel to the substrate surface were compared. The ratio of these diffraction intensities was Si {220}/Si (004)= 0.030.

Figure 8C:
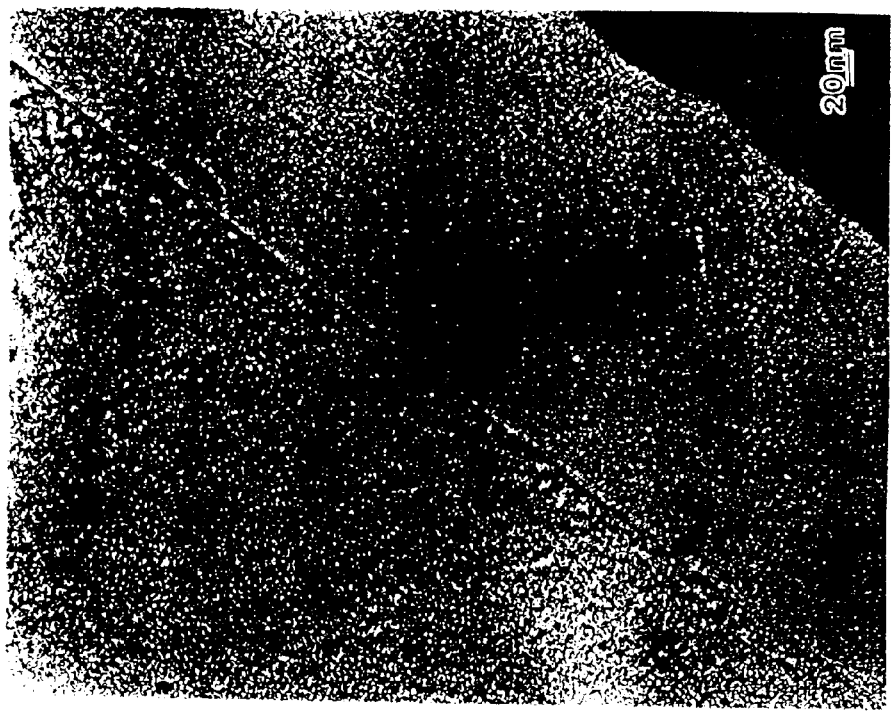
FIG. 8C is a photograph by TEM of a section of a substrate for observing the defect density of a silicon layer of an SOS substrate prepared in Example 6 of the present invention.

A part of this SOS substrate was cut out, and a section of this substrate was observed in an Si<110> direction under a transmission electron microscope (TEM). As shown in FIG. 8C, crystalline defects were confirmed to disappear throughout the silicon layer.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 500 µS, the drain breakdown voltage was 8.5 V, the SVG was $1.0 \times 10^{-12} V^2/Hz$, and the ESD was 3,000 V. The radio frequency characteristics were also evaluated similarly, showing the cut-off frequency to be 6.5 GHz. The Qbd of the gate oxide film was 2.4 $C/cm^2$.

EXAMPLE 8

A 200 nm thick first silicon layer was deposited on an R-plane sapphire substrate at a growth temperature of 950° C. by LPCVD using monosilane ($SiH_4$) gas as a starting material.

Then, the composite was introduced into an oxidation furnace, where it was dry oxidized at 1,000° C. for 360 minutes, with 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material, to prepare a desired SOS substrate. After growth, the total film thickness of silicon was measured, and found to be 200 nm.

The defect density was measured in the same manner as in Example 1, and found to be $5.0 \times 10^7 /cm^2$. Similarly, the Rrms was measured with AFM, and found to be 2.0 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 430 µS, the drain breakdown voltage was 7.8 V, the SVG was $3.5 \times 10^{-12} V^2/Hz$, and the ESD was 2,400 V. The radio frequency characteristics were also evaluated similarly, showing the cut-off frequency to be 5.2 GHz. The Qbd of the gate oxide film was 0.8 $C/cm^2$.

EXAMPLE 9

A 200 nm thick first silicon layer was deposited on an R-plane sapphire substrate at a growth temperature of 950° C. by LPCVD using monosilane ($SiH_4$) gas as a starting material.

Then, the composite was introduced into an oxidation furnace, where it was steam oxidized at 900° C. for 90 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material, to prepare a desired SOS substrate. After growth, the total film thickness of silicon was measured, and found to be 200 nm.

The defect density was measured in the same manner as in Example 1, and found to be $6.0 \times 10^7 /cm^2$. Similarly, the Rrms was measured with AFM, and found to be 1.7 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 430 µS, the drain breakdown voltage was 7.7 V, the SVG was $4.0 \times 10^{-12} V^2/Hz$, and the ESD was 2,400 V. The radio frequency characteristics were also evaluated similarly, showing the cut-off frequency to be 5.2 GHz. The Qbd of the gate oxide film was 0.7 $C/cm^2$.

EXAMPLE 10

A 200 nm thick first silicon layer was deposited on an R-plane sapphire substrate at a growth temperature of 950° C. by LPCVD using monosilane ($SiH_4$) gas as a starting material.

Then, the composite was introduced into an oxidation furnace, where it was steam oxidized at 1,100° C. for 15 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane ($Si_2H_6$) as a starting material, to prepare a desired SOS substrate. After growth, the total film thickness of silicon was measured, and found to be 200 nm.

The defect density was measured in the same manner as in Example 1, and found to be $3.5 \times 10^7 /cm^2$. Similarly, the Rrms was measured with AFM, and found to be 1.5 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 450 $\mu$S, the drain breakdown voltage was 8.1 V, the SVG was $2.1 \times 10^{-12}$ V$^2$/Hz, and the ESD was 2,500 V. The radio frequency characteristics were also evaluated similarly, showing the cut-off frequency to be 5.4 GHz. The Qbd of the gate oxide film was 1.2 C/cm$^2$.

EXAMPLE 11

A 200 nm thick first silicon layer was deposited on an R-plane sapphire substrate at a growth temperature of 950° C. by LPCVD using monosilane (SiH$_4$) gas as a starting material.

The silicon layer was implanted with $1 \times 10^{16}$/cm$^2$ of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour, for recrystallization of the silicon layer.

Then, the composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer. Then, the thickness of the seed silicon layer was measured, and found to be 100 nm.

Then, a second silicon layer was deposited on the seed silicon layer at a growth temperature of 750° C. by UHV-CVD using disilane (Si$_2$H$_6$) as a starting material, to prepare a desired SOS substrate.

To improve the surface flatness of this SOS substrate, CMP (chemical mechanical polishing) was performed to polish out the silicon layer measuring 45 nm. After polishing, the thickness of the silicon layer was measured, and found to be 190 nm.

The defect density was measured in the same manner as in Example 1, and found to be $2.4 \times 10^7$/cm$^2$. Similarly, the Rrms was measured with AFM, and found to be 0.3 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 440 $\mu$S, the drain breakdown voltage was 8.2 V, the SVG was $1.9 \times 10^{-12}$ V$^2$/Hz, and the ESD was 2,600 V. The radio frequency characteristics were also evaluated similarly, showing the cut-off frequency to be 5.3 GHz. The Qbd of the gate oxide film was 1.5 C/cm$^2$.

EXAMPLE 12

A 200 nm thick first silicon layer was deposited on an R-plane sapphire substrate at a growth temperature of 950° C. by LPCVD using monosilane (SiH$_4$) gas as a starting material.

Then, the composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer to prepare a desired SOS film. The thickness of the silicon layer was 100 nm.

The defect density was measured in the same manner as in Example 1, and found to be $7.1 \times 10^7$/cm$^2$. Similarly, the Rrms was measured with AFM, and found to be 2.3 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 420 $\mu$S, the drain breakdown voltage was 7.7 V, the SVG was $3.5 \times 10^{-12}$ V$^2$/Hz, and the ESD was 2,400 V. The radio frequency characteristics were also evaluated similarly, showing the cut-off frequency to be 5.2 GHz. The Qbd of the gate oxide film was 0.7 C/cm$^2$.

EXAMPLE 13

A 200 nm thick first silicon layer was deposited on an R-plane sapphire substrate at a growth temperature of 950° C. by LPCVD using monosilane (SiH$_4$) gas as a starting material.

The silicon layer was implanted with $1 \times 10^{16}$/cm$^2$ of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour, for recrystallization of the silicon layer.

Then, the composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer and prepare a desired SOS film. The thickness of the silicon layer was 100 nm.

The defect density was measured in the same manner as in Example 1, and found to be $3.1 \times 10^7$/cm$^2$. Similarly, the Rrms was measured with AFM, and found to be 2.1 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 440 $\mu$S, the drain breakdown voltage was 7.9 V, the SVG was $2.0 \times 10^{-12}$ V$^2$/Hz, and the ESD was 2,500 V. The radio frequency characteristics were also evaluated similarly, showing the cut-off frequency to be 5.3 GHz. The Qbd of the gate oxide film was 1.2 C/cm$^2$.

EXAMPLE 14

A 200 nm thick first silicon layer was deposited on an R-plane sapphire substrate at a growth temperature of 950° C. by LPCVD using monosilane (SiH$_4$) gas as a starting material.

Then, the composite was heat treated at 1,100° C. for 30 minutes in a hydrogen atmosphere at a pressure of 80 Torr.

The silicon layer was implanted with $1 \times 10^{16}$/cm$^2$ of silicon ions having an energy of 190 keV, with the substrate being kept at a temperature of 0° C., to make the deep portion of the silicon layer amorphous. Then, the composite was heat treated in a nitrogen atmosphere at a temperature of 550° C. for 1 hour, and then at a temperature of 900° C. for 1 hour, for recrystallization of the silicon layer.

Then, the composite was introduced into an oxidation furnace, where it was steam oxidized at 1,000° C. for 30 minutes, with 180 liters/min of hydrogen and 180 liters/min of oxygen being introduced. The oxidized composite was immersed in BHF to remove an oxide film on the first silicon layer and prepare a desired SOS film. The thickness of the silicon layer was 100 nm.

The defect density was measured in the same manner as in Example 1, and found to be $2.9 \times 10^7/cm^2$. Similarly, the Rrms was measured with AFM, and found to be 1.1 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 440 $\mu$S, the drain breakdown voltage was 7.9 V, the SVG was $1.5 \times 10^{-12} V^2/Hz$, and the ESD was 2,500 V. The radio frequency characteristics were also evaluated similarly, showing the cut-off frequency to be 5.3 GHz. The Qbd of the gate oxide film was 1.4 C/cm$^2$.

EXAMPLE 15

A 200 nm thick silicon layer was deposited on an R-plane sapphire substrate at a growth temperature of 950° C. by LPCVD using monosilane (SiH$_4$) gas as a starting material. Then, the composite was heat treated at 1,150° C. for 1 hour in a hydrogen atmosphere at a pressure of 80 Torr to prepare an SOS substrate.

The defect density was measured in the same manner as in Example 1, and found to be $3.0 \times 10^8/cm^2$. Similarly, the Rrms was measured with AFM, and found to be 1.5 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 390 $\mu$S, the drain breakdown voltage was 7.7 V, the SVG was $4.5 \times 10^{-12} V^2/Hz$, and the ESD was 2,100 V. The radio frequency characteristics were also evaluated similarly, showing the cut-off frequency to be 4.6 GHz. The Qbd of the gate oxide film was 0.5 C/cm$^2$.

EXAMPLE 16

An SOS substrate having a silicon layer thickness of 200 nm was prepared in the same manner as in Example 15, except that the pressure of hydrogen during the heat treatment in the hydrogen atmosphere was set at 760 Torr.

The defect density was measured in the same manner as in Example 1, and found to be $2.5 \times 10^8/cm^2$. Similarly, the Rrms was measured with AFM, and found to be 1.5 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 380 $\mu$S, the drain breakdown voltage was 7.7 V, the SVG was $4.4 \times 10^{-12} V^2/Hz$, and the ESD was 2,100 V. The radio frequency characteristics were also evaluated similarly, showing the cut-off frequency to be 4.5 GHz. The Qbd of the gate oxide film was 0.5 C/cm$^2$.

EXAMPLE 17

An SOS substrate having a silicon layer thickness of 200 nm was prepared in the same manner as in Example 15, except that the temperature during the heat treatment in the hydrogen atmosphere was set at 1,050° C.

The defect density was measured in the same manner as in Example 1, and found to be $3.5 \times 10^8/cm^2$. Similarly, the Rrms was measured with AFM, and found to be 1.5 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 375 $\mu$S, the drain breakdown voltage was 7.7 V, the SVG was $4.6 \times 10^{-12} V^2/Hz$, and the ESD was 2,100 V. The radio frequency characteristics were also evaluated similarly, showing the cut-off frequency to be 4.4 GHz. The Qbd of the gate oxide film was 0.5 C/cm$^2$.

EXAMPLE 18

An SOS substrate having a silicon layer thickness of 200 nm was prepared in the same manner as in Example 15, except that the duration of the heat treatment in the hydrogen atmosphere was set at 10 minutes.

The defect density was measured in the same manner as in Example 1, and found to be $3.7 \times 10^8/cm^2$. Similarly, the Rrms was measured with AFM, and found to be 1.8 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 375 $\mu$S, the drain breakdown voltage was 7.5 V, the SVG was $5.6 \times 10^{-12} V^2/Hz$, and the ESD was 2,100 V. The radio frequency characteristics were also evaluated similarly, showing the cut-off frequency to be 4.4 GHz. The Qbd of the gate oxide film was 0.4 C/cm$^2$.

EXAMPLE 19

A 200 nm thick silicon layer was deposited on an R-plane sapphire substrate at a growth temperature of 950° C. by LPCVD using monosilane (SiH$_4$) gas as a starting material.

The silicon layer was implanted with $1 \times 10^{16}/cm^2$ of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour.

Then, the composite was heat treated at 1,150° C. for 1 hour in a hydrogen atmosphere at a pressure of 80 Torr to prepare an SOS substrate.

The defect density was measured in the same manner as in Example 1, and found to be $8.0 \times 10^7/cm^2$. Similarly, the Rrms was measured with AFM, and found to be 0.8 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 435 $\mu$S, the drain breakdown voltage was 7.9 V, the SVG was $3.0 \times 10^{-12} V^2/Hz$, and the ESD was 2,500 V. The radio frequency characteristics were also evaluated similarly, showing the cut-off frequency to be 5.2 GHz. The Qbd of the gate oxide film was 1.0 C/cm$^2$.

EXAMPLE 20

On a silicon (100) substrate, $\gamma$-Al$_2$O$_3$ was deposited at a substrate temperature of 880° C. by UHV-CVD using trimethyl aluminum and oxygen as starting materials. A film after growth was observed using RHEED and XRD. Growth of single crystalline $\gamma$-Al$_2$O$_3$ was confirmed.

On the $\gamma$-Al$_2$O$_3$ layer, a 200 nm thick silicon layer was deposited at a growth temperature of 950° C. by UHVCVD using disilane (Si$_2$H$_6$) as a starting material to prepare an SOI substrate.

Then, the composite was heat treated at 1,150° C. for 1 hour in a hydrogen atmosphere at a pressure of 80 Torr to prepare an SOI substrate.

The defect density was measured in the same manner as in Example 1, and found to be $3.0 \times 10^8/cm^2$. Similarly, the Rrms was measured with AFM, and found to be 1.5 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 380 $\mu$S, the drain breakdown voltage was 7.5 V, the SVG was $6.0 \times 10^{-12} V^2/Hz$, and the ESD was 2,100 V. The radio frequency characteristics were also evaluated similarly, showing the cut-off frequency to be 4.5 GHz. The Qbd of the gate oxide film was 0.5 $C/cm^2$.

EXAMPLE 21

A 100 nm thick first silicon layer was deposited on an R-plane sapphire substrate at a growth temperature of 950° C. by LPCVD using monosilane ($SiH_4$) gas as a starting material. At this time, supply of the monosilane gas was suspended. With the composite being placed in a growth chamber, the substrate temperature was raised to 1,150° C., and a hydrogen gas at a pressure of 80 Torr was introduced to apply heat treatment for 1 hour. Then, monosilane gas was supplied again to the growth chamber to further deposit a 100 nm thick silicon layer on the silicon seed layer at a substrate temperature of 700° C. In this manner, an SOS substrate having a silicon layer thickness of 200 nm was prepared.

The defect density was measured in the same manner as in Example 1, and found to be $2.0 \times 10^8/cm^2$. Similarly, the Rrms was measured with AFM, and found to be 1.0 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 390 $\mu$S, the drain breakdown voltage was 7.8 V, the SVG was $5.0 \times 10^{-12} V^2/Hz$, and the ESD was 2,300 V. The radio frequency characteristics were also evaluated similarly, showing the cut-off frequency to be 4.6 GHz. The Qbd of the gate oxide film was 0.6 $C/cm^2$.

EXAMPLE 22

A 100 nm thick first silicon layer was deposited on an R-plane sapphire substrate at a growth temperature of 950° C. by LPCVD using monosilane ($SiH_4$) gas as a starting material.

The silicon layer was implanted with $5 \times 10^{15}/cm^2$ of silicon ions having an energy of 150 keV, with the substrate being kept at a temperature of 0° C., to make the deep portion or the silicon layer amorphous. Then, the composite was heat treated in a nitrogen atmosphere at a temperature of 550° C. for 1 hour, and then at a temperature of 900° C. for 1 hour. Then, the composite was heat treated at 1,150° C. for 1 hour in a hydrogen atmosphere at a pressure of 80 Torr.

Then, monosilane gas was supplied again to a growth chamber to further deposit a 100 nm thick silicon layer on the silicon seed layer at a substrate temperature of 700° C. In this manner, an SOS substrate having a silicon layer thickness of 200 nm was prepared.

The defect density was measured in the same manner as in Example 1, and found to be $7.3 \times 10^6/cm^2$. Similarly, the Rrms was measured with AFM, and found to be 1.0 nm.

The crystallographic properties were evaluated using HR-XRD by the same methods as in Example 1. The FWHM of the XRC of an Si (004)-plane was 681 arcsec. The lattice constant in a direction parallel to the substrate surface, and that in a direction perpendicular to the substrate surface were 5.439 Å and 5.421 Å, respectively. Thus, the ratio of these lattice constants was 1.0033. Similarly, the diffraction intensities of the Si (004)-plane and Si {220}-plane parallel to the substrate surface were compared. The ratio of these diffraction intensities was Si {220}/Si (004)= 0.044.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 480 $\mu$S, the drain breakdown voltage was 8.1 V, the SVG was $1.8 \times 10^{-12} V^2/Hz$, and the ESD was 2,800 V. The radio frequency characteristics were also evaluated similarly, showing the cut-off frequency to be 6.0 GHz. The Qbd of the gate oxide film was 2.0 $C/cm^2$.

EXAMPLE 23

A 200 nm thick first silicon layer was deposited on an R-plane sapphire substrate at a growth temperature of 950° C. by LPCVD using monosilane ($SiH_4$) gas as a starting material.

Then, the composite was heat treated at 1,150° C. for 1 hour in a hydrogen atmosphere at a pressure of 80 Torr.

The silicon layer was implanted with $1 \times 10^{16}/cm^2$ of silicon ions having an energy of 190 keV, with the substrate being kept at a temperature of 0° C., to make the deep portion of the silicon layer amorphous. Then, the composite was heat treated in a nitrogen gas atmosphere at a temperature of 550° C. for 1 hour, and then at a temperature of 900° C. for 1 hour.

The defect density was measured in the same manner as in Example 1, and found to be $6.8 \times 10^7/cm^2$. Similarly, the Rrms was measured with AFM, and found to be 1.4 nm.

Furthermore, an NMOS transistor and a capacitor of the same sizes as in Example 1 were prepared in the same manner as in Example 1 for evaluation of the respective items. Their device performance was evaluated by the same methods as in Example 1.

The transconductance was 420 $\mu$S, the drain breakdown voltage was 7.8 V, the SVG was $3.5 \times 10^{-12} V^2/Hz$, and the ESD was 2,500 V. The radio frequency characteristics were also evaluated similarly, showing the cut-off frequency to be 5.2 GHz. The Qbd of the gate oxide film was 1.0 $C/cm^2$.

INDUSTRIAL APPLICABILITY

As described above, according to the present invention, a silicon layer with very few crystalline defects and having satisfactory surface flatness can be formed on an insulating layer on silicon substrate, such as a single crystalline oxide substrate comprising sapphire or the like, or a multiple-layer substrate comprising a silicon substrate and a crystalline oxide layer deposited thereon, such as a layer of $\alpha$-$Al_2O_3$, $\gamma$-$Al_2O_3$, $\theta$-$Al_2O_3$, $MgO \cdot Al_2O_3$, $CeO_2$, $SrTiO_3$, $(Zr_{1-x},Y_x)O_y$, $Pb(Zr,Ti)O_3$, $LiTaO_3$, or $LiNbO_3$, or a crystalline fluoride layer, such as a layer of $CaF_2$. Thus, it becomes possible to prepare on the SOI substrate of the invention a device with enhanced device performance and reliability, such as reduced flicker noise, a raised operating speed, increased gate oxide film breakdown voltage and increased ESD, which have been unattainable with conventional SOS substrates.

What is claimed is:

1. An SOI substrate comprising an insulating base, and a crystalline silicon layer epitaxially grown on the insulating base, wherein the insulating base is a single crystal oxide substrate, a multi-layered substrate comprising a silicon substrate and a crystalline oxide layer, or a crystalline fluoride layer deposited on the silicon substrate, and wherein the defect density of the crystalline silicon layer determined by a defect density measuring method using an iodine-containing etching solution is not more than $4 \times 10^8/cm^2$ in an entire depth direction, and the surface roughness of the crystalline silicon layer is not more than 4 nm but not less than 0.05 nm.

2. The SOI substrate of claim 1, wherein the defect density of the crystal silicon layer determined by a defect density measuring method using an iodine-containing etching solution is not more than $1 \times 10^7/cm^2$ in an entire depth direction.

3. The SOI substrate of claim 1 or 2, wherein the full width at half maximum of the X-ray diffraction rocking curve of a (004)-peak in the crystalline silicon layer, grown parallel to the surface of the substrate, is not more than 1,000 arcsec but not less than 100 arcsec.

4. The SOI substrate of claim 1, wherein the lattice constant of a silicon (100)-plane in the crystalline silicon layer perpendicular to the surface of the substrate is not less than 5.41 Ås but not more than 5.44 Ås.

5. The SOI substrate of claim 1, wherein the lattice constant of a silicon (001)-plane in the crystalline silicon layer parallel to the surface of the substrate is not more than 5.44 Ås but not less than 5.41 Ås.

6. The SOI substrate of claim 1, wherein the ratio of the lattice constant of a silicon (001)-plane in the crystalline silicon layer parallel to the surface of the substrate to the lattice constant of a silicon (100)-plane in the crystalline silicon layer perpendicular to the surface of the substrate is not more than 1.005 but not less than 0.995.

7. The SOI substrate of claim 1, wherein the ratio of the intensity of a (220)-reflection to the intensity of a (004)-reflection in the crystalline silicon layer parallel to the surface of the substrate, both reflections determined in X-ray diffraction measurement, is not more than 0.1.

8. The SOI substrate of claim 1, wherein the insulating base is the single crystalline oxide substrate, and the single crystalline oxide substrate is a sapphire substrate.

9. The SOI substrate of claim 1, wherein the insulating base is on the multi-layered substrate, and the crystalline oxide layer deposited on the silicon substrate as a substrate of the laminated substrate comprises a member selected from the group consisting of $\alpha$-$Al_2O_3$, $\gamma$-$Al_2O_3$, $\theta$-$Al_2O_3$, $MgO.Al_2O_3$, $CeO_2$, $SrTiO_3$, $(Zr_{1-x},Y_x)O_y$, $Pb(Zr,Ti)O_3$, $LiTaO_3$, or $LiNbO_3$ and the fluoride layer comprises $CaF_2$.

10. The SOI substrate of claim 1 wherein the thickness of the silicon layer is 0.03 $\mu$m to 0.7 $\mu$m.

11. A method for producing an SOI substrate having a silicon layer with a low defect density formed on an insulating base, comprising the steps of:

(a) forming a first silicon layer on the insulating base;
(b) heat treating the first silicon layer in an oxidizing atmosphere containing a gas mixture of oxygen and hydrogen or containing steam to oxidize a part of the first silicon layer;
(c) removing a silicon oxide film formed in the preceding step (b) by etching; and
(d) epitaxially growing a second silicon layer on the remaining first silicon layer.

12. The method of claim 11, further comprising repeating the steps (b) to (d) two or more times with the silicon layer formed in the step (d) being regarded as the first silicon layer formed in the step (a) in each repeat of steps (b) to (d).

13. The method of claim 11, wherein the temperature of heat treatment in the oxidizing atmosphere is not lower than 600° C. but not higher than 1,300° C.

14. The method of claim 11, wherein the temperature of heat treatment in the oxidizing atmosphere is not lower than 800° C. but not higher than 1,200° C.

15. The method of claim 11 wherein the temperature for epitaxial growth of the second silicon layer on the remaining first silicon layer is not lower than 550° C. but not higher than 1,050° C.

16. The method of claim 11, wherein the temperature for epitaxial growth of the second silicon layer on the remaining first silicon layer is not lower than 650° C. but not higher than 950° C.

17. The method of claim 11, wherein the remaining first silicon layer is heat treated in a hydrogen atmosphere or in a vacuum before the step of epitaxially growing the second silicon layer on the remaining first silicon layer.

18. The method of claim 11, wherein no silicon oxide is formed on the surface of the remaining first silicon layer or in the second silicon layer in the step of epitaxially growing the second silicon layer on the remaining first silicon layer.

19. The method of claim 11, wherein the pressure used in epitaxially growing the second silicon layer on the remaining first silicon layer is $10^{-7}$ Torr or less.

20. The method of claim 11, wherein a method for epitaxially growing the second silicon layer on the remaining first silicon layer is UHV-CVD or MBE.

21. The method of claim 11, wherein when epitaxially growing the second silicon layer on the remaining first silicon layer, a growth temperature is set higher at an initial stage of growth than in the subsequent stages.

22. The method of claim 21, wherein a method for epitaxially growing the second silicon layer is APCVD or LPCVD.

23. The method of claim 11, further including the step of heat treating the SOI substrate in a nitrogen atmosphere after the step of epitaxially growing the second silicon layer.

24. The method of claim 23, further including the step of heat treating the SOI substrate in an oxidizing atmosphere after the step of heat treating the SOI substrate in the nitrogen atmosphere.

25. The method of claim 11, further including the step of heat treating the SOI substrate in a hydrogen atmosphere after the step of epitaxially growing the second silicon layer.

26. The method of claim 25, wherein the temperature of the heat treatment in a hydrogen atmosphere is not lower than 800° C. but not higher than 1,200° C.

27. The method of any one of claims 13–22, 23, 24, 25, and 26, further including the step of implanting silicon ions immediately after the step of forming the first silicon layer, to make a deep portion of the silicon layer amorphous, and annealing said amorphous silicon to recrystallize at least a portion thereof.

28. The method of claim 27, further comprising repeating the steps (b) to (d) two or more times with the silicon layer formed in the step (d) being regarded as the first silicon layer formed in the step (a) in each repeat of steps (b) to (d).

29. The method of claim 27, wherein the insulating base is a single crystalline oxide substrate.

30. The method of claim 27, wherein the insulating base is a multi-layered substrate comprising a silicon substrate and at least one additional layer deposited on the silicon substrate selected from the group consisting of a crystalline oxide layer and a crystalline fluoride layer deposited on the silicon substrate.

31. The method of claim 11, further including the step of implanting silicon ions immediately after the step of forming the first silicon layer, to make a deep portion of the silicon layer amorphous, and annealing said amorphous silicon to recrystallize at least a portion thereof.

32. The method of claim 31, wherein the annealing is performed first in a nitrogen atmosphere, and then performed in an oxidizing atmosphere.

33. The method of claim 32, further including the step of removing a silicon oxide film by etching after the annealing in the oxidizing atmosphere.

34. The method of claim 11, further comprising the step of polishing the silicon layer after the step of epitaxially growing the second silicon layer.

35. The method of any one of claims 13–22, 23, 24, 25–33, and 34, wherein the step of forming the first silicon layer on the insulating base comprises epitaxially growing the first silicon layer on the insulating base.

36. The method of claim 35, further comprising repeating the steps (b) to (d) two or more times with the silicon layer formed in the step (d) being regarded as the first silicon layer formed in the step (a) in each repeat of steps (b) to (d).

37. The method of claim 35, wherein the insulating base is a single crystalline oxide substrate.

38. The method of claim 35, wherein the insulating base is a multi-layered substrate comprising a silicon substrate and at least one additional layer deposited on the silicon substrate selected from the group consisting of a crystalline oxide layer and a crystalline fluoride layer deposited on the silicon substrate.

39. The method of any one of claims 13–22, 23, 24, 25–33, and 34, wherein the insulating base is a single crystalline oxide substrate.

40. The method of claim 39, further comprising repeating the steps (b) to (d) two or more times with the silicon layer formed in the step (d) being regarded as the first silicon layer formed in the step (a) in each repeat of steps (b) to (d).

41. The method of claim 39, wherein the insulating base is a multi-layered substrate comprising a silicon substrate and at least one additional layer deposited on the silicon substrate selected from the group consisting of a crystalline oxide layer and a crystalline fluoride layer deposited on the silicon substrate.

42. The method of claim 11, wherein the step of forming the first silicon layer on the insulating base comprises epitaxially growing the first silicon layer on the insulating base.

43. The method of claim 11, wherein the insulating base is a single crystalline oxide substrate.

44. The method of claim 43, wherein the insulating base is a sapphire substrate.

45. The method of any one of claims 13–22, 23, 24, 25–33, and 34–44, wherein the insulating base is a multi-layered substrate comprising a silicon substrate and at least one additional layer deposited on the silicon substrate selected from the group consisting of a crystalline oxide layer and a crystalline fluoride layer deposited on the silicon substrate.

46. The method of claim 45, further comprising repeating the steps (b) to (d) two or more times with the silicon layer formed in the step (d) being regarded as the first silicon layer formed in the step (a) in each repeat of steps (b) to (d).

47. The method of claim 11, wherein the insulating base is a multi-layered substrate comprising a silicon substrate and at least one additional layer deposited on the silicon substrate selected from the group consisting of a crystalline oxide layer and a crystalline fluoride layer deposited on the silicon substrate.

48. The method of claim 47, wherein the crystalline oxide layer comprises any of $\alpha\text{-}Al_2O_3$, $\gamma\text{-}Al_2O_3$, $\theta\text{-}Al_2O_3$, $MgO\cdot Al_2O_3$, $CeO_2$, $SrTiO_3$, $(Zr_{1-x},Y_x)O_y$, $Pb(Zr,Ti)O_3$, $LiTaO_3$, or $LiNbO_3$, and any crystalline fluoride layer comprises $CaF_2$.

49. The method of any one of claims 13–22, 23, 24, 25–33, 34–47, further comprising repeating the steps (b) to (d) two or more times with the silicon layer formed in the step (d) being regarded as the first silicon layer formed in the step (a) in each repeat of steps (b) to (d).

50. A method for producing an SOI substrate having a silicon layer with a low defect density formed on an insulating base, comprising the steps of:
(a) forming a first silicon layer on the insulating base;
(b) implanting silicon ions into the first silicon layer, to make a deep portion of the first silicon layer amorphous, performing annealing for recrystallization, and then heat treating the first silicon layer in a hydrogen atmosphere; and
(c) epitaxially growing a second silicon layer on the first silicon layer heat treated in a hydrogen atmosphere.

51. The method of claim 50, wherein the steps (a) to (c) are performed in situ.

52. The method of claim 50 or 51, wherein the temperature of the heat treatment in hydrogen is not lower than 800° C. but not higher than 1,200° C.

53. The method of claim 50, further including the step of implanting silicon ions immediately after the step of heat treating the first silicon layer in a hydrogen atmosphere, to make a deep portion of the silicon layer amorphous, and performing annealing for recrystallization.

54. The method of claim 53, wherein the annealing is performed first in a nitrogen atmosphere, and then performed in an oxidizing atmosphere.

55. The method of claim 54, further including the step of removing a silicon oxide film by etching after the annealing in the oxidizing atmosphere.

56. The method of claim 50, further comprising the step of applying chemical and/or mechanical polishing to the silicon layer after the step of epitaxially growing the second silicon layer.

57. The method of any one of claims 50, 51, 53, 54, 55, and 56, wherein the step of forming the first silicon layer on the insulating base is the step of epitaxially growing the first silicon layer on the insulating base.

58. The method of any one of claims 50, 51, 53, 54, 55, and 56, wherein the insulating base is a single crystalline oxide substrate.

59. The method of claim 58, wherein the single crystalline oxide substrate is a sapphire substrate.

60. The method of any one of claims 50, 51, 53, 54, 55, and 56, wherein the insulating base is a multi-layered substrate comprising a silicon substrate as a substrate and a crystalline oxide layer or fluoride layer deposited on the silicon substrate.

61. The method of claim 60, wherein the crystalline oxide layer comprises any of $\alpha\text{-}Al_2O_3$, $\gamma\text{-}Al_2O_3$, $\theta\text{-}Al_2O_3$, $MgO\cdot Al_2O_3$, $CeO_2$, $SrTiO_3$, $(Zr_{1-x},Y_x)O_y$, $Pb(Zr,Ti)O_3$, $LiTaO_3$, or $LiNbO_3$, and the crystalline fluoride layer comprises $CaF_2$.

62. An SOI substrate produced by the method of any one of claims 11–22, 23, 24, 25–33, 34–48, 50, 51, 53, 54, 55, and 56.

63. A semiconductor device having an SOI substrate produced by the method of any one of claims 11–22, 23, 24, 25–33, 34–48, 50, 51, 53, 54, 55, and 56.

64. The semiconductor device of claim 63, which is at least one of a field effect transistor and a bipolar transistor, and wherein the device performance improved by using the SOI substrate is at least one of transconductance, cut-off frequency, flicker noise, and electrostatic discharge.

65. A semiconductor device having an SOI substrate used as a substrate, wherein the SOI substrate comprising an insulating base, and a crystalline silicon layer epitaxially grown on the insulating base, wherein the insulating base is a single crystalline oxide substrate, a multi-layered substrate comprising a silicon substrate and a crystalline oxide layer, or a crystalline fluoride layer deposited on the silicon substrate, and wherein the defect density of the crystalline silicon layer determined by a defect density measuring method using an iodine-containing etching solution is not more than $4 \times 10^8 / cm^2$ in an entire depth direction, and the surface roughness of the crystalline silicon layer is not more than 4 nm but not less than 0.05 nm.

66. The semiconductor device of claim 65, which is MOSFET.

67. The semiconductor device of claim 65, which is a bipolar transistor.

68. The semiconductor device of claim 65, which is a diode.

69. The semiconductor device of claim 65, which is a semiconductor integrated circuit.

70. The semiconductor device of claim 65, which is a semiconductor integrated circuit composed of MOSFET.

71. A semiconductor device having an SOI substrate used as a substrate, wherein the SOI substrate comprises an insulating base, and a crystalline silicon layer epitaxially grown on the insulating base, wherein the insulating base is a single crystalline oxide substrate, a multi-layered substrate comprising a silicon substrate and a crystalline oxide layer, or a crystalline fluoride layer deposited on the silicon substrate, and wherein the defect density of the crystalline silicon layer determined by a defect density measuring method using an iodine-containing etching solution is not more than $4 \times 10^8 / cm^2$ in an entire depth direction, and the surface roughness of the crystalline silicon layer is not more than 4 nm but not less than 0.05 nm wherein the semiconductor device is at least one of a field effect transistor and a bipolar transistor, and wherein the device characteristics improved by using the SOI substrate of any one of claims 1, 2, 4, 5, 6, 7, 8, and 9 as the SOI substrate of the semiconductor device are at least one of mutual inductance, cut-off frequency, flicker noise, and electrostatic discharge.

72. A method for producing a semiconductor device on an SOI substrate comprising an insulating base, and a silicon layer formed on the insulating base, comprising the steps of:

(a) forming a first silicon layer on the insulating base;

(b) heat treating the first silicon layer in an oxidizing atmosphere comprising a mixture of oxygen and hydrogen or steam to oxidize a part of the first silicon layer;

(c) removing a silicon oxide film formed in the preceding step (b) by etching;

(d) epitaxially growing a second silicon layer on the remaining first silicon layer; and (e) heat treating a silicon layer, formed in the preceding step (d), in an oxidizing atmosphere to oxidize a part of the surface of the silicon layer, and then removing a silicon oxide film, which has been formed, by etching to adjust the silicon layer to a desired thickness.

73. The method of claim 72, further implanting the step of injecting silicon ions after the step of forming the first silicon layer, to make a deep portion of the silicon layer amorphous, and annealing said amorphous silicon to recrystallize at least a portion thereof.

74. The method of claim 72, further comprising the step of heat treating a silicon layer in a hydrogen atmosphere after the step (d) of epitaxially growing the second silicon layer.

75. The method of claim 72, further comprising performing chemical and/or mechanical polishing of a silicon layer before or after the step (e).

76. A method for producing a semiconductor device on an SOI substrate comprising an insulating base, and a silicon layer formed on the insulating base, comprising the steps of:

(a) forming a first silicon layer on the insulating base;

(b) implanting silicon ions immediately after the step of forming the first silicon layer, to make a deep portion of the first silicon layer amorphous, annealing to recrystallize at least a portion thereof, and then heat treating the first silicon layer in a hydrogen atmosphere;

(c) epitaxially growing a second silicon layer on the first silicon layer heat treated in a hydrogen atmosphere; and (d) heat treating a silicon layer, formed in the step (c), in an oxidizing atmosphere to oxidize a part of the silicon layer, and then removing the silicon oxide film, which has been formed, by etching to adjust the silicon layer to a desired thickness.

77. The method of claim 76, further comprising performing chemical and/or mechanical polishing to the resulting silicon layer before or after the step (d).

* * * * *

UNITED STATES PATENT AND TRADEMARK OFFICE
CERTIFICATE OF CORRECTION

PATENT NO. : 6,528,387 B1
APPLICATION NO. : 09/446306
DATED : March 4, 2003
INVENTOR(S) : Yoshitaka Moriyasu et al.

It is certified that error appears in the above-identified patent and that said Letters Patent is hereby corrected as shown below:

On the Title page, "(22) Filed: December 20, 1999," should read --(22) PCT Filed: June 19, 1998--.

On the Title page, after item (22), add:

--(86)    PCT No.: PCT/JP98/02756

§ 371(c)(1),
(2), (4) Date: Dec. 20, 1999

(87)    PCT Pub. No.: WO98/58408

PCT Pub. Date: Dec. 23, 1998--.

Claim 4, column 35, line 24, "(100) -plane" should read --(100)-plane--.

Claim 9, column 35, line 50, "$MgO.Al_2O_3$," should read --$MgO·Al_2O_3$,--.

Claim 35, column 37, line 19, "25-33," should read --25, 26, 31-33,--.

Claim 39, column 37, line 35, "25-33," should read --25, 26, 31-33,--.

Claim 45, column 37, line 56, "25-33, and 34-44," should read --25, 26, 31-33, 34, and 42-44,--.

Claim 49, column 38, line 11, "25-33, 34-47," should read --25, 26, 31-33, 34, 42-44, 47,--.

Claim 62, column 38, line 66, "25-33, 34-48," should read --25, 26, 31-33, 34, 42-44, 47, 48,--.

UNITED STATES PATENT AND TRADEMARK OFFICE
CERTIFICATE OF CORRECTION

PATENT NO. : 6,528,387 B1
APPLICATION NO. : 09/446306
DATED : March 4, 2003
INVENTOR(S) : Yoshitaka Moriyasu et al.

It is certified that error appears in the above-identified patent and that said Letters Patent is hereby corrected as shown below:

Claim 63, column 39, line 3, "25-33, 34-48," should read --25, 26, 31-33, 34, 42-44, 47, 48,--.

Signed and Sealed this

First Day of July, 2008

JON W. DUDAS
*Director of the United States Patent and Trademark Office*